United States Patent
Tokunaga

(10) Patent No.: US 11,927,622 B2
(45) Date of Patent: Mar. 12, 2024

(54) SEMICONDUCTOR DEVICE, SEMICONDUCTOR TESTING DEVICE, AND SEMICONDUCTOR DEVICE TESTING METHOD

(71) Applicant: SONY SEMICONDUCTOR SOLUTIONS CORPORATION, Kanagawa (JP)

(72) Inventor: Masashi Tokunaga, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 379 days.

(21) Appl. No.: 17/250,653

(22) PCT Filed: Jul. 23, 2019

(86) PCT No.: PCT/JP2019/028775
§ 371 (c)(1),
(2) Date: Feb. 16, 2021

(87) PCT Pub. No.: WO2020/044871
PCT Pub. Date: Mar. 5, 2020

(65) Prior Publication Data
US 2021/0311112 A1    Oct. 7, 2021

(30) Foreign Application Priority Data

Aug. 31, 2018  (JP) .................... 2018-162238

(51) Int. Cl.
*G01R 31/28*  (2006.01)
*H01L 23/00*  (2006.01)
(Continued)

(52) U.S. Cl.
CPC .......... *G01R 31/2886* (2013.01); *H01L 24/08* (2013.01); *H01L 25/0657* (2013.01);
(Continued)

(58) Field of Classification Search
CPC . G01R 31/2886; G01R 31/2884; H01L 24/08; H01L 25/0657; H01L 27/14634;
(Continued)

(56) References Cited

U.S. PATENT DOCUMENTS 8,344,749 B2 *   1/2013   Stillman ............ G01R 31/2886
                                              324/762.02
2008/0048706 A1   2/2008   Shimizume et al.
(Continued)

FOREIGN PATENT DOCUMENTS

CN   101154654 A    4/2008
CN   104237640 A   12/2014
(Continued)

OTHER PUBLICATIONS

International Search Report and Written Opinion of PCT Application No. PCT/JP2019/028775, dated Oct. 1, 2019, 08 pages of ISRWO.

*Primary Examiner* — Giovanni Astacio-Oquendo
(74) *Attorney, Agent, or Firm* — CHIP LAW GROUP

(57) ABSTRACT

An abnormality resulting from connection between a plurality of substrates is easily detected in a semiconductor device including a multilayer semiconductor substrate. The semiconductor device includes a plurality of semiconductor substrates, a connection member, a power supply terminal, and an observation terminal. The connection member is electrically connected on joint surfaces of the plurality of semiconductor substrates to form at least one connection line that extends over the plurality of semiconductor substrates. The power supply terminal is connected to one end of the connection line, and the observation terminal is connected to the other end of the connection line. Power is
(Continued)

supplied to the power supply terminal. The observation terminal is used to observe a resistance state of the connection line.

11 Claims, 21 Drawing Sheets

(51) Int. Cl.
*H01L 25/065* (2023.01)
*H01L 27/146* (2006.01)
(52) U.S. Cl.
CPC .. *H01L 27/14634* (2013.01); *H01L 27/14636* (2013.01); *H01L 24/06* (2013.01); *H01L 2224/06517* (2013.01); *H01L 2224/08145* (2013.01); *H01L 2225/06544* (2013.01)
(58) Field of Classification Search
CPC .............. H01L 27/14636; H01L 24/06; H01L 2224/06517; H01L 2224/08145; H01L 2225/06544; H01L 27/14621; H01L 27/14627; H01L 27/14609

USPC ....................... 324/762.03, 762.01, 537, 500
See application file for complete search history.

(56) References Cited

U.S. PATENT DOCUMENTS

| | | |
|---|---|---|
| 2014/0368224 A1 | 12/2014 | Lee |
| 2020/0135594 A1* | 4/2020 | Lee ......................... H01L 22/32 |
| 2021/0104272 A1* | 4/2021 | Sakui .................. H01L 25/0657 |
| 2021/0366973 A1* | 11/2021 | Horikoshi ............... H01L 24/80 |
| 2022/0085093 A1* | 3/2022 | Mitsuhashi ............. H01L 25/18 |
| 2023/0024598 A1* | 1/2023 | Ono ........................ H01L 25/07 |

FOREIGN PATENT DOCUMENTS

| | | |
|---|---|---|
| JP | 2008-051591 A | 3/2008 |
| JP | 2017-117828 A | 6/2017 |
| KR | 10-2014-0146822 A | 12/2014 |
| TW | 200828479 A | 7/2008 |
| TW | 201735204 A | 10/2017 |
| TW | 201820567 A | 6/2018 |

\* cited by examiner

SEMICONDUCTOR DEVICE, SEMICONDUCTOR TESTING DEVICE, AND SEMICONDUCTOR DEVICE TESTING METHOD

CROSS REFERENCE TO RELATED APPLICATIONS

This application is a U.S. National Phase of International Patent Application No. PCT/JP2019/028775 filed on Jul. 23, 2019, which claims priority benefit of Japanese Patent Application No. JP 2018-162238 filed in the Japan Patent Office on Aug. 31, 2018. Each of the above-referenced applications is hereby incorporated herein by reference in its entirety.

TECHNICAL FIELD

The present technology relates to a semiconductor device testing method. Specifically, the present technology relates to a semiconductor device, a semiconductor testing device, and a testing method for these devices.

BACKGROUND ART

Demanded functions of a semiconductor device have covered a wide range, and efforts have been made to achieve multi-functioning and higher integration. Due to this, a semiconductor device including a multilayer semiconductor substrate having a plurality of semiconductor substrates bonded and stacked is used. For example, a solid-state image pickup element having a pixel substrate and a logic substrate electrically connected to each other is proposed (refer to, for example, PTL 1).

CITATION LIST

Patent Literature

[PTL 1]
Japanese Patent Laid-open No. 2017-117828

SUMMARY

Technical Problems

With the conventional technology described above, a plurality of substrates that are stacked can be electrically connected to each other. However, as the substrates are connected by more connections, it is more difficult to locate a failure, and it takes a longer time to analyze the failure. The present technology has been achieved in light of such circumstances and an object of the present technology is to easily detect an abnormality resulting from connection between a plurality of substrates.

Solution to Problems

The present technology has been made to solve the above problems, and a first aspect of the present technology is a semiconductor device including a plurality of semiconductor substrates; a connection member that is electrically connected on joint surfaces of the plurality of semiconductor substrates to form at least one connection line that extends over the plurality of semiconductor substrates; a power supply terminal connected to one end of the connection line; and an observation terminal connected to another end of the connection line. This can produce an effect of causing a state of the connection line extending over the plurality of semiconductor substrates to be observed.

Moreover, according to this first aspect, the connection member may include a metal electrode that is formed on the joint surfaces of the plurality of semiconductor substrates and that is brought into contact so as to be electrically connected. This can produce an effect of electrically connecting the plurality of semiconductor substrates by the metal electrode.

Further, according to this first aspect, the connection member may include a through-hole that penetrates at least one of the plurality of semiconductor substrates. This can produce an effect of electrically connecting the plurality of semiconductor substrates by the through-hole.

Further, according to this first aspect, the connection line may be formed in the vicinity of regions to be observed on the plurality of semiconductor substrates. This can produce an effect of detecting a failure occurring in a specific region.

Further, according to this first aspect, the connection member may include a plurality of the connection lines each of which has one end connected to the power supply terminal and which are formed in different regions on the plurality of semiconductor substrates. This can produce an effect of observing a plurality of different regions on the semiconductor substrates. In this case, the semiconductor device may further include a selector that selects any one of other ends of the plurality of connection lines and that connects the selected other end to the observation terminal. This can produce an effect of observing a plurality of regions while changing over the regions.

Further, a second aspect of the present technology is a semiconductor testing device including a semiconductor device including a connection member that is electrically connected on joint surfaces of a plurality of semiconductor substrates to form at least one connection line that extends over the plurality of semiconductor substrates, a power supply terminal connected to one end of the connection line, and an observation terminal connected to another end of the connection line; a power supply that supplies power to the power supply terminal; and an observation instrument that is connected to the observation terminal and that observes a current-carrying state. This can produce an effect of observing a state of the connection line extending over the plurality of semiconductor substrates by the observation instrument.

Further, according to this second aspect, the power supply may be a direct-current power supply, and the observation instrument may be an ammeter that measures a current passed through the observation terminal from the power supply terminal. This can produce an effect of measuring a resistance state of the connection line extending over the plurality of semiconductor substrates.

Further, according to this second aspect, the connection member may include a plurality of the connection lines each of which has one end connected to the power supply terminal and which are formed in different regions on the plurality of semiconductor substrates. This can produce an effect of measuring a resistance state of the connection line in the different regions on the plurality of semiconductor substrates. In this case, the semiconductor testing device may further include a selector that selects any one of other ends of the plurality of connection lines and that connects the selected other end to the observation terminal. This can produce an effect of measuring resistance states of the plurality of connection lines while changing over the connection lines.

Furthermore, a third aspect of the present technology is a testing method for a semiconductor device including a connection member that is electrically connected on joint surfaces of a plurality of semiconductor substrates to form a plurality of connection lines that extend over the plurality of semiconductor substrates, a power supply terminal connected to one end of each of the plurality of connection lines, a selector that selects any one of other ends of the plurality of connection lines, and an observation terminal connected to an output of the selector, the testing method including a procedure of supplying power to the power supply terminal; a procedure of sequentially selecting the plurality of connection lines by the selector; and a procedure of observing current-carrying states of the plurality of connection lines via the observation terminal and detecting the connection line indicating a resistance state higher than a predetermined threshold as a failure location. This can produce an effect of observing current-carrying states of the connection lines extending over the plurality of semiconductor substrates and detecting a failure location.

DESCRIPTION OF EMBODIMENTS

Modes for carrying out the present technology (hereinafter, referred to as "embodiments") will hereinafter be described. Description will be given in the following order.
1. Embodiment
2. Modifications 1. Embodiment

Figure 1:
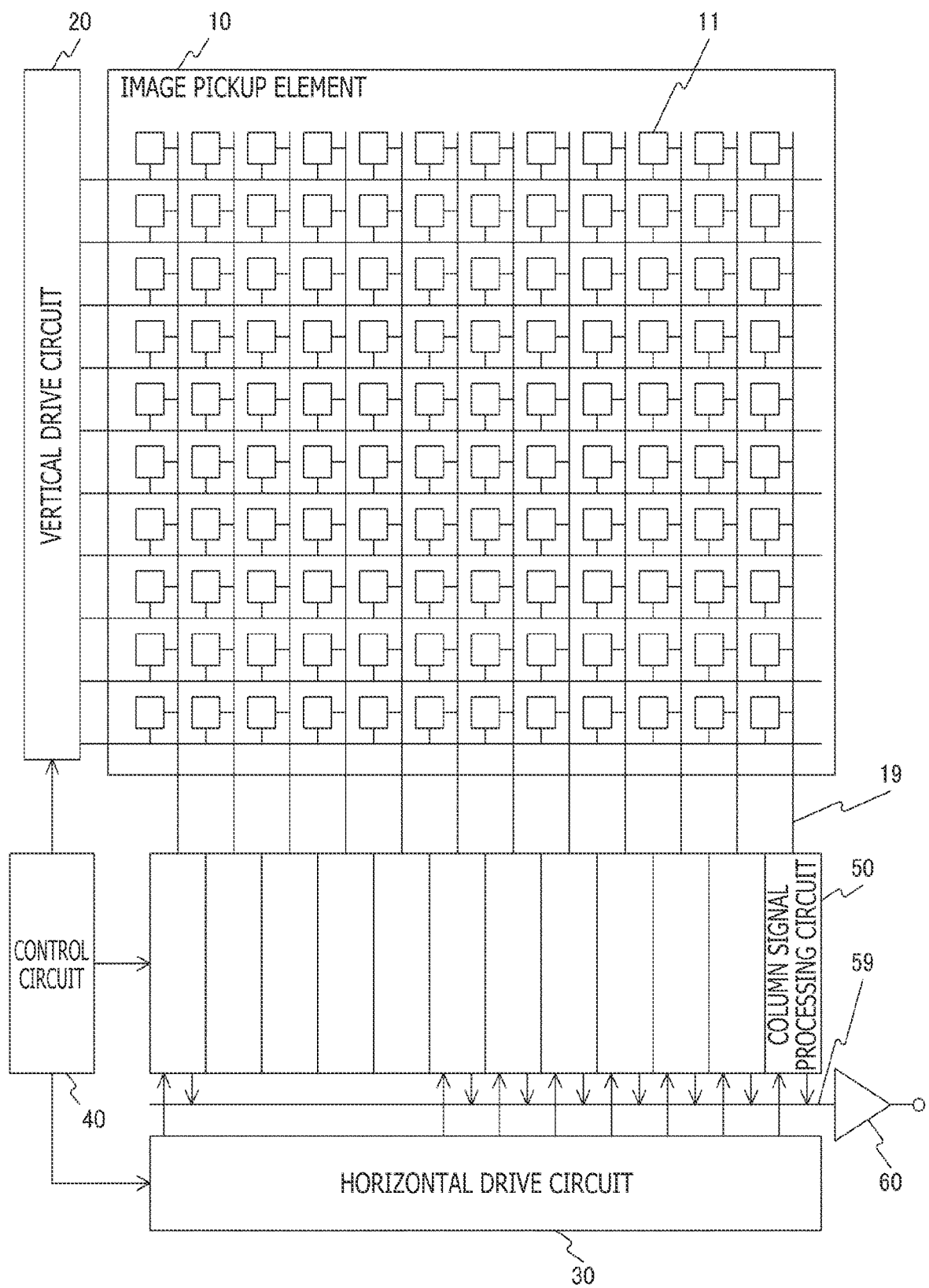
FIG. 1 is a diagram depicting an example of configurations of a solid-state imaging device that is an example of a semiconductor device according to an embodiment of the present technology.

[Configurations of Semiconductor Device]
FIG. 1 is a diagram depicting an example of configurations of a solid-state imaging device that is an example of a semiconductor device according to an embodiment of the present technology. This solid-state imaging device is configured as a CMOS (Complementary Metal Oxide Semiconductor) image sensor. This solid-state imaging device has an image pickup element 10 and a peripheral circuit section on a semiconductor substrate (for example, silicon substrate) (not depicted). The peripheral circuit section includes a vertical drive circuit 20, a horizontal drive circuit 30, a control circuit 40, column signal processing circuits 50, and an output circuit 60.

The image pickup element 10 is a pixel array in which a plurality of pixels 11 each including a photoelectric conversion section are arranged in a two-dimensional array. Each of the pixels 11 includes the photoelectric conversion section, which is, for example, a photodiode, and a plurality of pixel transistors. The plurality of pixel transistors can be configured here by three transistors, for example, a transfer transistor, a reset transistor, and an amplification transistor. Alternatively, the plurality of pixel transistors can be configured by four transistors by adding a selection transistor to the three transistors. It is noted that an equivalent circuit of a unit pixel is not described in detail since the equivalent circuit is similar to a commonly used equivalent circuit.

Further, the pixels 11 can each be configured as one unit pixel or can each have a pixel sharing structure. This pixel sharing structure is a structure that a plurality of photodiodes share a floating diffusion and the transistors other than the transfer transistor.

The vertical drive circuit 20 drives the pixels 11 in each row. The vertical drive circuit 20 includes, for example, a shift register. The vertical drive circuit 20 selects a pixel drive interconnection and supplies a pulse for driving the pixels 11 to the selected pixel drive interconnection. The vertical drive circuit 20 thereby selectively scans the pixels 11 in the image pickup element 10 in row units and in a sequential manner in a vertical direction, and supplies pixel signals based on signal electric charges generated by the photoelectric conversion sections of the pixels 11 according to amounts of light received, to the column signal processing circuits 50 via vertical signal lines (VSLs) 19.

The horizontal drive circuit 30 drives the column signal processing circuit 50 in each column. The horizontal drive circuit 30 includes, for example, a shift register. The horizontal drive circuit 30 selects the column signal processing circuits 50 in a sequential order by sequentially outputting horizontal scanning pulses and causes each column signal processing circuit 50 to output pixel signals to a horizontal signal line 59.

The control circuit 40 exercises control over the entirety of the solid-state imaging device. The control circuit 40 receives an input clock and data for issuing a command of an operation mode or the like, and outputs such data as internal information regarding the solid-state imaging device. In other words, the control circuit 40 generates clock signals and control signals that serve as a reference for operations of the vertical drive circuit 20, the column signal processing circuits 50, the horizontal drive circuit 30, and the like, on the basis of a vertical synchronizing signal, a horizontal synchronizing signal, and a master clock. The control circuit 40 then inputs these signals to the vertical drive circuit 20, the column signal processing circuits 50, the horizontal drive circuit 30, and the like.

Each column signal processing circuit 50 is disposed, for example, per column of the pixels 11 and performs such signal processing as noise removal per pixel column on the signals output from the pixels 11 corresponding to one row. In other words, the column signal processing circuit 50 performs such signal processing as CDS (Correlated Double Sampling), signal amplification, and AD (Analog/Digital) conversion for removing a fixed pattern noise specific to the pixels 11. A horizontal selection switch (not depicted) is connected between an output stage of each column signal processing circuit 50 and each horizontal signal line 59.

The output circuit 60 performs signal processing on the signals sequentially supplied from the column signal processing circuits 50 through the horizontal signal lines 59, and outputs resultant signals. At that time, the output circuit 60 buffers the signals from the column signal processing circuits 50. In addition, the output circuit 60 may perform black level adjustment, column variation correction, various kinds of digital signal processing, and the like on the signals from the column signal processing circuits 50.

[Substrate Division]

Figure 2A:
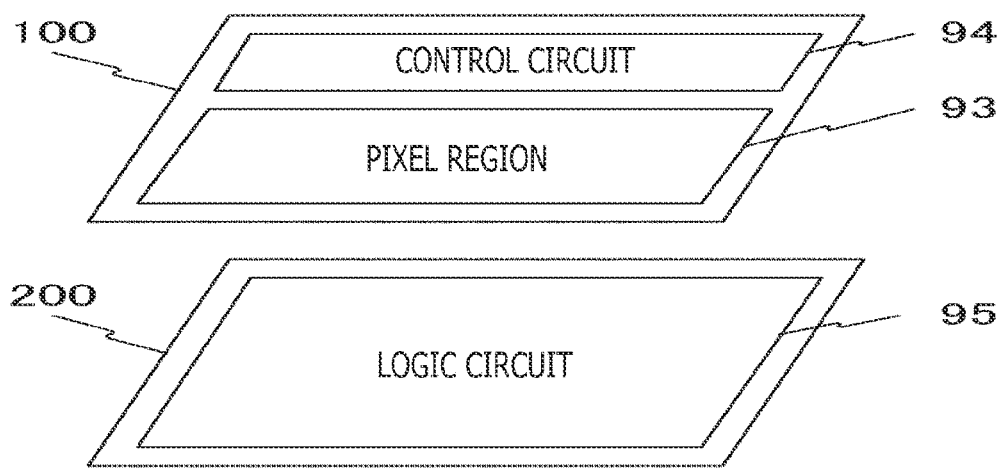
FIGS. 2A, 2B, and 2C illustrate diagrams depicting examples of dividing a substrate of the semiconductor device according to the embodiment of the present technology.
Figure 2B:
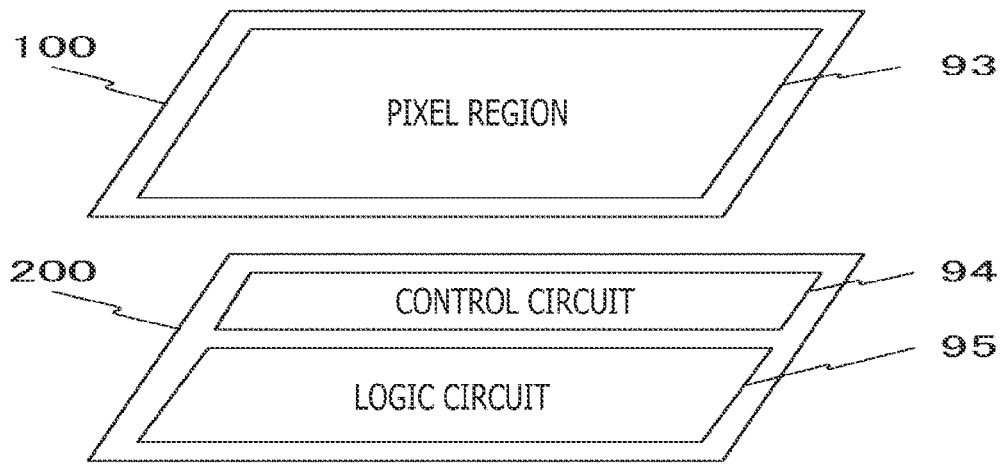
Figure 2C:
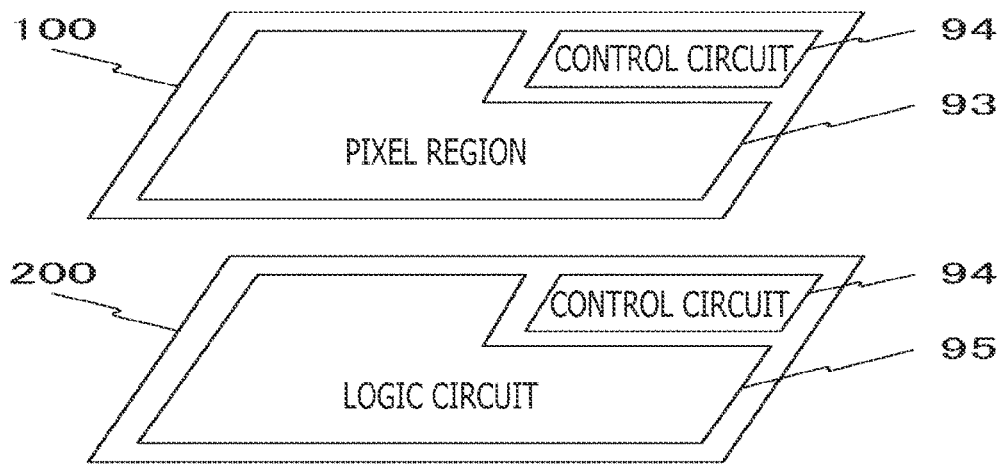

FIGS. 2A, 2B, and 2C illustrate diagrams depicting examples of dividing a substrate of the semiconductor device according to the embodiment of the present technology into a plurality of substrates.

In FIGS. 2A, 2B, and 2C, FIG. 2A depicts a first example. This first example includes the first semiconductor substrate 100 and the second semiconductor substrate 200. A pixel region 93 and a control circuit 94 are mounted on the first semiconductor substrate 100. A logic circuit 95 including a signal processing circuit is mounted on the second semiconductor substrate 200. Further, the solid-state imaging device serving as one semiconductor chip is configured by electrically connecting the first semiconductor substrate 100 and the second semiconductor substrate 200 to each other.

In FIGS. 2A, 2B, and 2C, FIG. 2B depicts a second example. This second example includes the first semiconductor substrate 100 and the second semiconductor substrate 200. The pixel region 93 is mounted on the first semiconductor substrate 100. The control circuit 94 and the logic circuit 95 including the signal processing circuit are mounted on the second semiconductor substrate 200. Further, the solid-state imaging device serving as one semiconductor chip is configured by electrically connecting the first semiconductor substrate 100 and the second semiconductor substrate 200 to each other.

In FIGS. 2A, 2B, and 2C, FIG. 2C depicts a third example. This third example includes the first semiconductor substrate 100 and the second semiconductor substrate 200. The pixel region 93 and the control circuit 94 controlling the pixel region 93 are mounted on the first semiconductor substrate 100. The logic circuit 95 including the signal processing circuit and the control circuit 94 controlling the logic circuit 95 are mounted on the second semiconductor substrate 200. Further, the solid-state imaging device serving as one semiconductor chip is configured by electrically connecting the first semiconductor substrate 100 and the second semiconductor substrate 200 to each other.

[Substrate Cross-Section]

Figure 3:
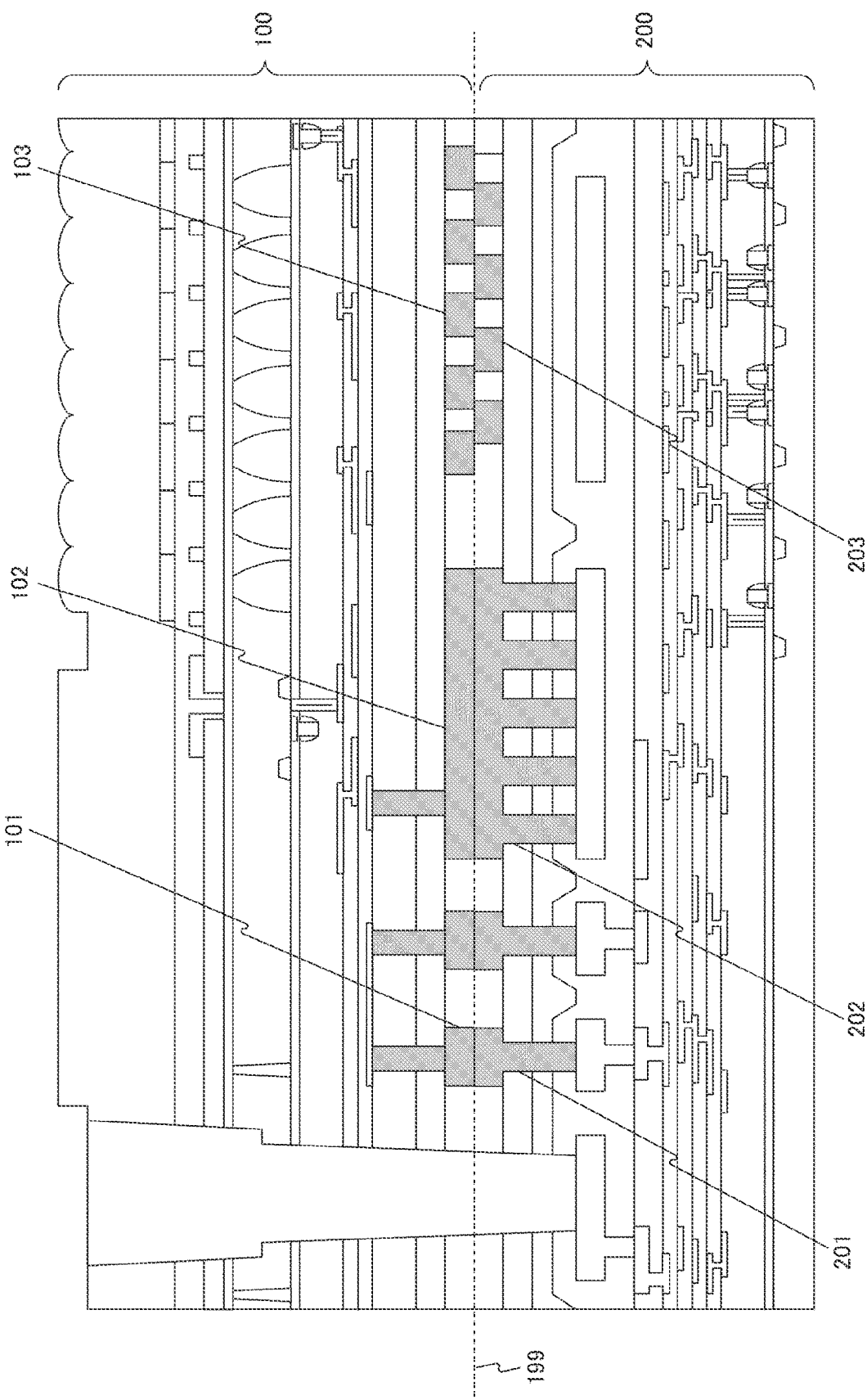
FIG. 3 is a diagram depicting an example of a substrate cross-section of the semiconductor device according to the embodiment of the present technology.

FIG. 3 is a diagram depicting an example of a substrate cross-section of the semiconductor device according to the embodiment of the present technology.

In this semiconductor imaging device, the first semiconductor substrate 100 and the second semiconductor substrate 200 are bonded together on joint surfaces 199, as described above. In this example, it is supposed that copper (Cu) interconnections are an example of connection members formed near the joint surfaces, and copper interconnections 101 to 103 on the first semiconductor substrate 100 are directly joined to copper interconnections 201 to 203 of the second semiconductor substrate 200.

The copper interconnections 101 and 201 are used for the purpose of electrically connecting the first semiconductor substrate 100 to the second semiconductor substrate 200. In other words, both of the copper interconnections 101 and 201 have connection holes and are formed to be connected to interiors of the respective substrates.

The copper interconnections 102 and 202 have a purpose of being used as interconnections on the second semiconductor substrate 200. In other words, the copper interconnection 102 is used as the interconnection on the first semiconductor substrate 100. Likewise, the copper interconnection 202 is used as the interconnection on the second semiconductor substrate 200.

The copper interconnections 103 and 203 electrically connect the first semiconductor substrate 100 to the second semiconductor substrate 200 but are not connected to internal interconnections. The copper interconnections 103 and 203 are what are generally called dummy interconnections. These interconnections are used to ensure flatness. It is noted that the copper interconnections can be used as shields by being connected to the internal interconnections.

Figure 4:
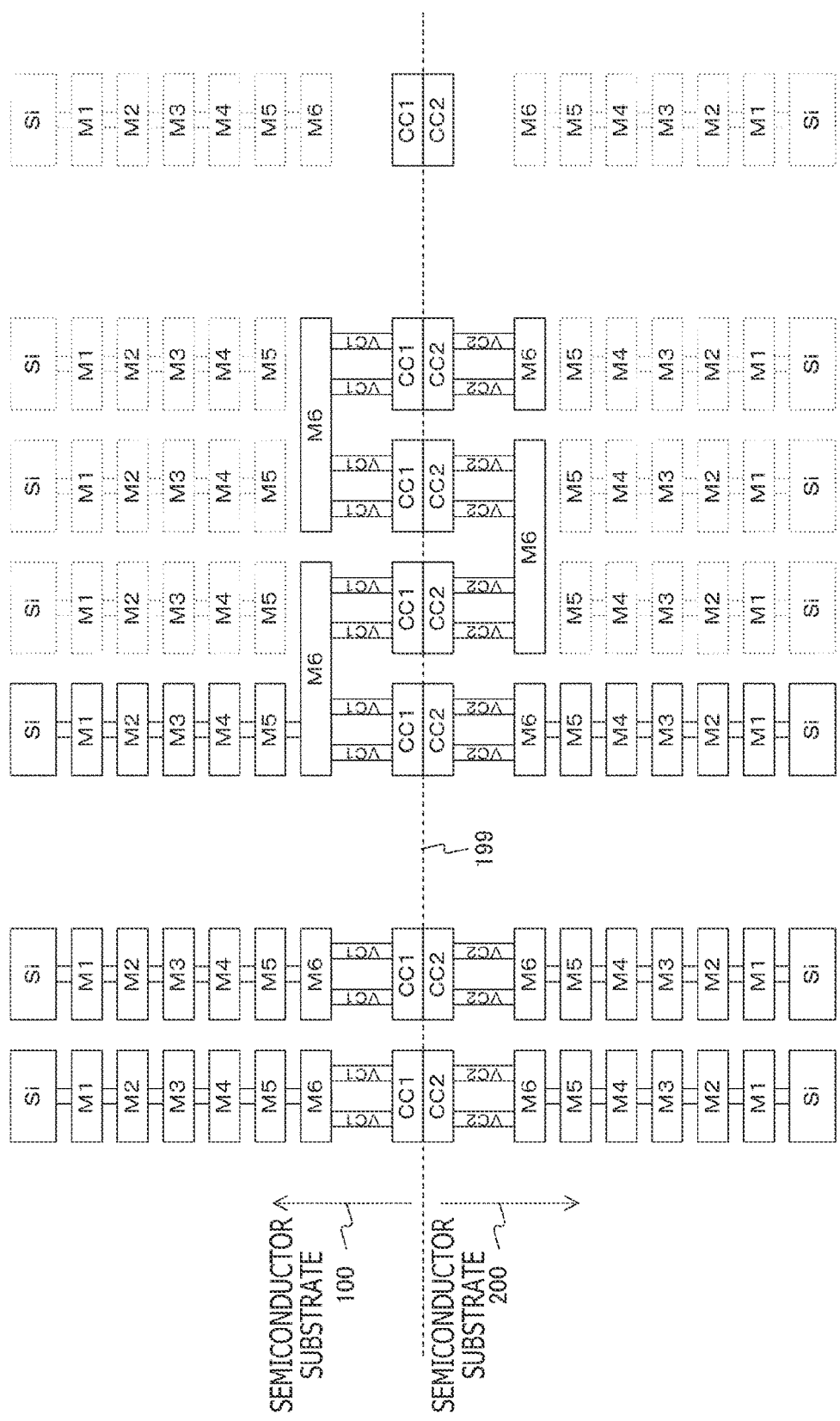
FIGS. 4A, 4B, and 4C illustrate diagrams depicting examples of a relation between copper interconnections and metal interconnection layers of the semiconductor device according to the embodiment of the present technology.

FIGS. 4A, 4B, and 4C illustrate diagrams depicting examples of a relation between copper interconnections and metal interconnection layers of the semiconductor device according to the embodiment of the present technology.

FIGS. 4A, 4B, and 4C depict here examples of bonding the first semiconductor substrate 100 to the second semiconductor substrate 200 on the joint surfaces 199 as described above. It is supposed, for example, that six metal interconnection layers are mounted on each of the first semiconductor substrate 100 and the second semiconductor substrate 200, and the six metal interconnection layers are denoted as M1 to M6 in order from a silicon (Si) layer.

Moreover, the copper interconnections on the first semiconductor substrate 100 and those on the second semiconductor substrate 200 are brought into contact with each other to be electrically connected to each other. Each copper interconnection on the first semiconductor substrate 100 is denoted as CC1, while that on the second semiconductor substrate 200 is denoted as CC2. Further, vertical connection of the copper interconnection CC1 to the metal interconnection layer M6 on the first semiconductor substrate 100 is denoted as VC1, while vertical connection of the copper interconnection CC2 to the metal interconnection layer M6 on the second semiconductor substrate 200 is denoted as VC2.

In FIGS. 4A, 4B, and 4C, FIG. 4A is an example of using the copper interconnections CC1 and CC2 for ordinary connection between the first semiconductor substrate 100 and the second semiconductor substrate 200. In this example, different pairs of copper interconnections CC1 and CC2 connect the first semiconductor substrate 100 to the second semiconductor substrate 200 independently of each other.

In FIG. 4B, a chain structure is formed by combinations of the copper interconnections CC1 and CC2 connecting the first semiconductor substrate 100 to the second semiconductor substrate 200 and the metal interconnection layers M6. Such connection of tying in a row is referred to as a "daisy chain." In this embodiment, a resistance state of the connection between the first semiconductor substrate 100 and the second semiconductor substrate 200 is observed using this daisy chain.

While FIG. 4C depicts the copper interconnections CC1 and CC2 connecting the first semiconductor substrate 100 to the second semiconductor substrate 200, the copper interconnections CC1 and CC2 in this case are not connected to the metal interconnection layers and do not function to transmit circuit signals. The copper interconnections CC1 and CC2 correspond to the dummy interconnections described above and are used mainly to ensure flatness.

[Substrate Plane Surface]

Figure 5:
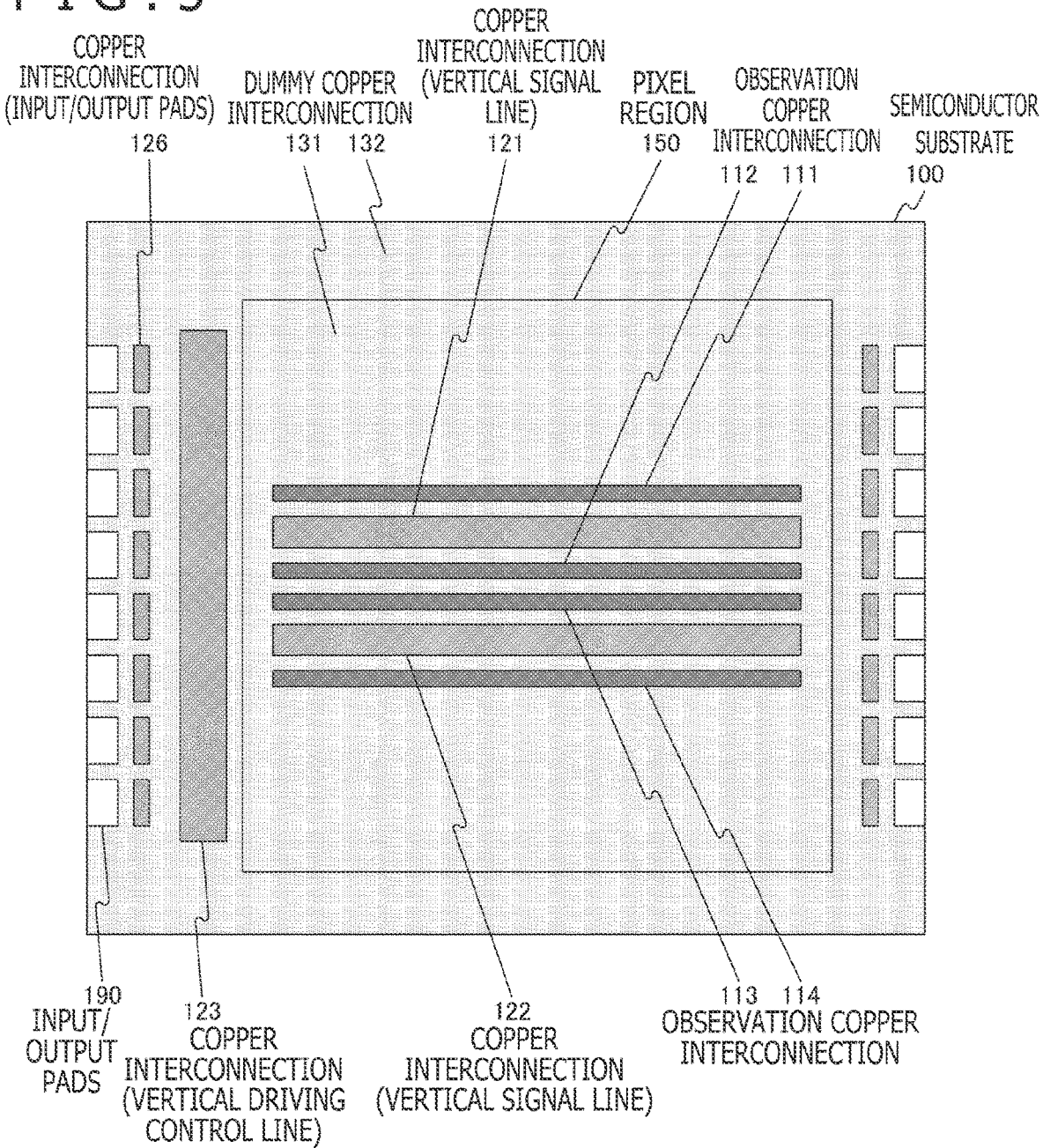
FIG. 5 is a diagram depicting an example of a plane surface of a first semiconductor substrate 100 according to the embodiment of the present technology.

FIG. 5 is a diagram depicting an example of a plane surface of the first semiconductor substrate 100 according to the embodiment of the present technology.

It is supposed herein that the image pickup element 10 described above is mounted on the first semiconductor substrate 100 and the column signal processing circuits 50 described above are mounted on the second semiconductor substrate 200. The first semiconductor substrate 100 depicted in FIG. 5 has a pixel region 150 including the image pickup element 10, in a central portion. In addition, the vertical signal lines (VSLs) 19 extending over the first and second semiconductor substrates 100 and 200 are connected by copper interconnections 121 and 122.

Further, it is supposed that the vertical drive circuit 20 described above is mounted on the second semiconductor substrate 200, and a vertical drive control signal line from the second semiconductor substrate 200 is connected by a copper interconnection 123 and supplied to the pixel region 150 on the first semiconductor substrate 100. It is noted that while an example of connecting the vertical drive control signal line by the copper interconnection 123 is described here, a horizontal drive control signal line may be connected by a copper interconnection depending on a form of circuit division.

Furthermore, the first semiconductor substrate 100 includes left and right input/output pads 190, through which the first semiconductor substrate 100 exchanges signals with outside and receives supply of power. Copper interconnections 126 are disposed in the vicinity of the input/output pads 190 and used for supply of power between the first semiconductor substrate 100 and the second semiconductor substrate 200.

On such a first semiconductor substrate 100, copper interconnections 111 to 114 for observation are disposed. The copper interconnections 111 and 112 are disposed in the vicinity of the copper interconnection 121 connecting the vertical signal line, and the copper interconnections 113 and 114 are disposed in the vicinity of the copper interconnection 122 connecting the vertical signal line. Resistance states of surroundings of the copper interconnections 121 and 122 connecting the vertical signal line are thereby observed. Normally, failure occurrence locations often concentrate in a specific region. Due to this, it is considered that observing resistance states of the surrounding copper interconnections enables estimation of a state of a region of the copper interconnections actually used to exchange signals, without observing resistance states of the latter copper interconnections. On the basis of such a premise, in this embodiment, the copper interconnections for observation are disposed in the vicinity of the copper interconnections to be observed.

It is noted that the copper interconnections 111 and 112 are an example of metal electrodes as connection members set forth in the claims. While the copper interconnections 111 and 112 are illustrated here as an example of the connection members, another example of the connection members may include through-holes penetrating at least one of the first semiconductor substrate 100 or the second semiconductor substrate 200. Specifically, the connection member may be a TCV (Through Chip Via), a TSV (Through Silicon Via), or the like.

Moreover, dummy copper interconnections 131 and 132 are disposed on the first semiconductor substrate 100 as needed. The dummy copper interconnections 131 and 132 are used to ensure the flatness as described above and are not connected to the interconnection layers. In this example, the dummy copper interconnection 131 inside the pixel region 150 and the dummy copper interconnection 132 outside the pixel region 150 are illustrated distinctively. The copper interconnections 131 and 132 may be set to have different sizes. For example, setting the size of the dummy copper interconnection 131 inside the pixel region 150 equal to a pixel size makes it possible to reduce an influence on an image.

[Copper Interconnection for Observation]

Figure 6:
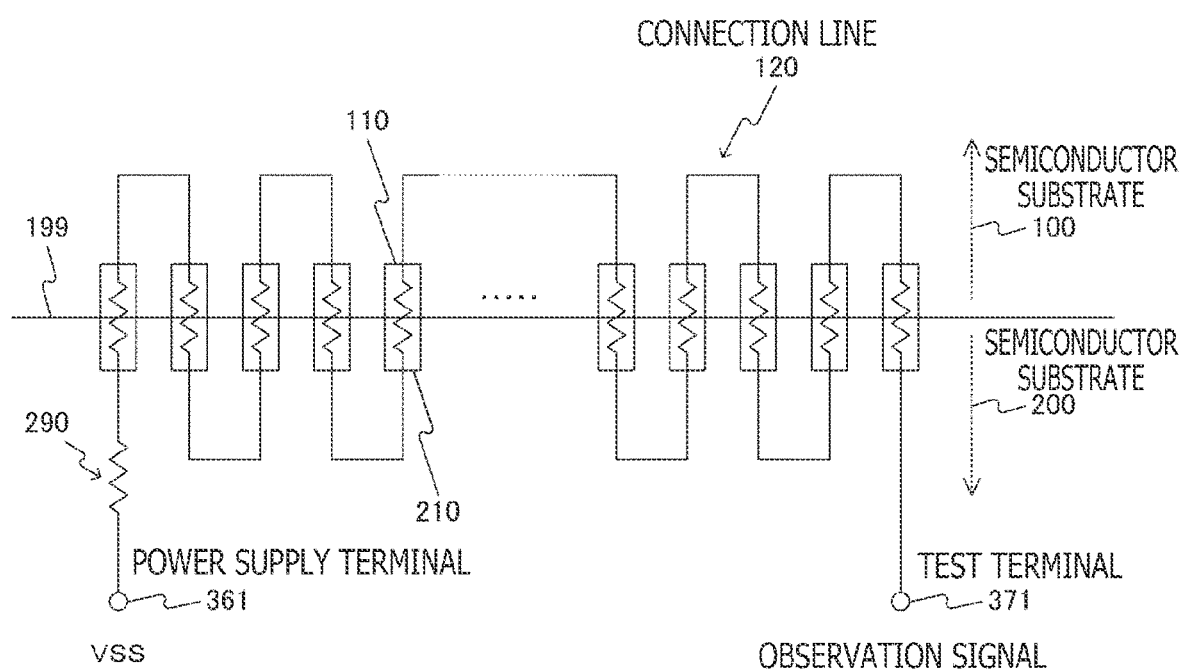
FIG. 6 is a diagram depicting an example of a cross-section of copper interconnections for observation according to the embodiment of the present technology.

FIG. 6 is a diagram depicting an example of a cross-section of copper interconnections for observation according to the embodiment of the present technology.

Here, as described above, an example of bonding the first semiconductor substrate 100 to the second semiconductor substrate 200 on the joint surfaces 199 is depicted. A copper interconnection 110 on the first semiconductor substrate 100 and a copper interconnection 210 on the second semiconductor substrate 200 are brought into contact with each other on the joint surfaces 199 to be electrically connected to each other. Further, the copper interconnections 110 and 210 are connected through the metal interconnection layers on the first semiconductor substrate 100 and the second semiconductor substrate 200 to form one connection line 120.

A power supply terminal 361 is connected to one end of the connection line 120 via a resistor 290, and direct-current power VSS is supplied to the power supply terminal 361. A test terminal 371 is connected to the other end of the connection line 120, and an observation signal is output from the test terminal 371. A resistance state of the connection line 120 can be observed on the basis of a current value of this observation signal and a voltage value of the direct-current power VSS. It is noted that the test terminal 371 is an example of an observation terminal set forth in the claims.

It is noted that, while it is supposed in this example that power is supplied from the second semiconductor substrate 200 to the first semiconductor substrate 100, this power can be supplied from any one of the first semiconductor substrate 100 or the second semiconductor substrate 200. In other words, power may be supplied from the first semiconductor substrate 100 to the second semiconductor substrate 200. Likewise, the test terminal 371 may be provided on any one of the first semiconductor substrate 100 or the second semiconductor substrate 200.

Figure 7:
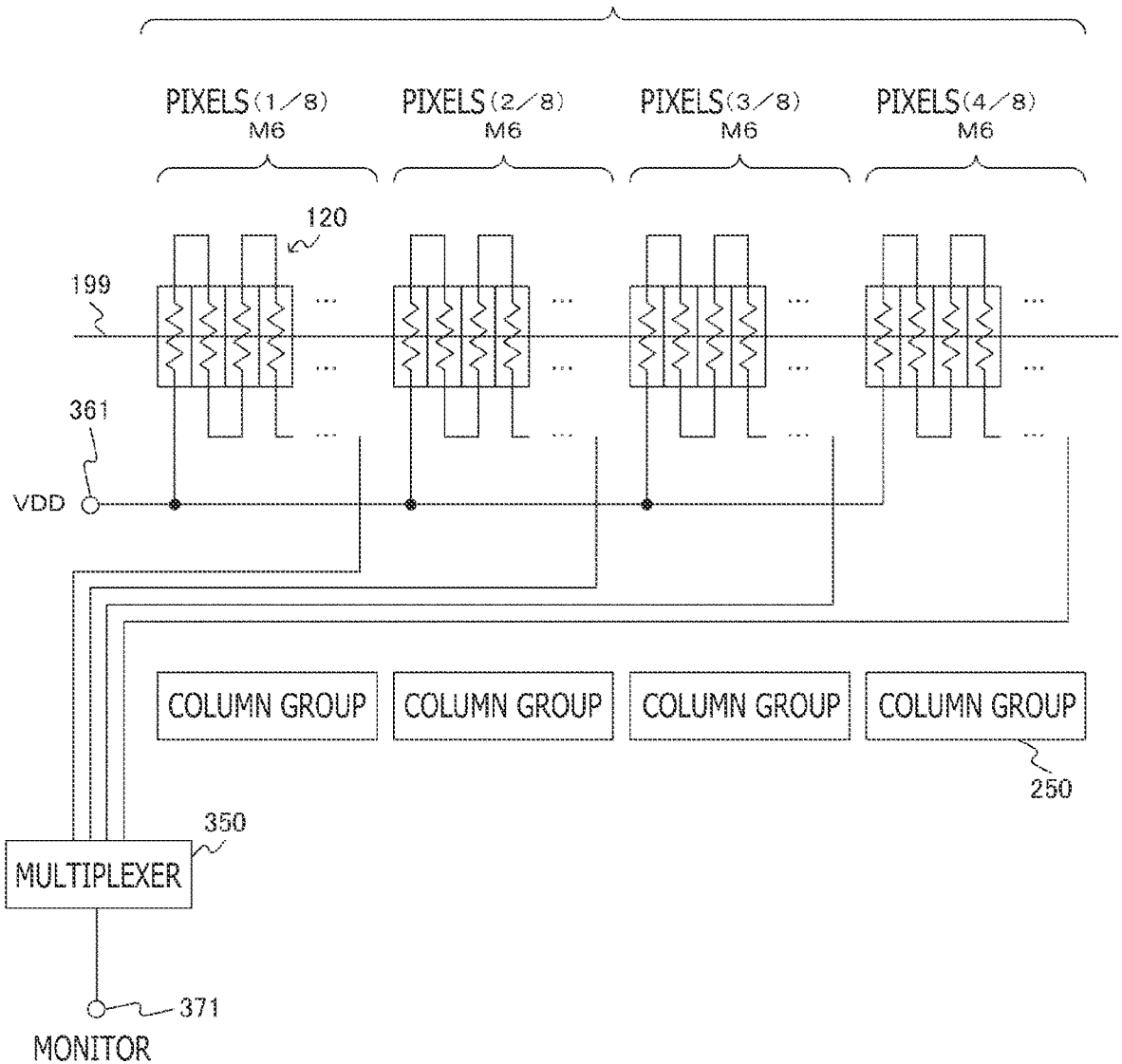
FIG. 7 is a diagram depicting an example of groups of copper interconnections for observation according to the embodiment of the present technology.

FIG. 7 is a diagram depicting an example of groups of copper interconnections for observation according to the embodiment of the present technology.

It is supposed here, for example, that 9,000 pixels on the vertical signal lines (VSLs) 19 aligned in the horizontal direction are divided into eight groups each including 1,125 pixels and that four groups are allocated to each of the two copper interconnections 121 and 122. In FIG. 7, therefore, four connection lines 120 corresponding to the 4,500 pixels in all are illustrated as the copper interconnection 121 (or copper interconnection 122).

The connection line corresponding to each group includes the copper interconnections and the interconnections of the metal interconnection layer M6. One end of each connection line is connected to the common power supply terminal 361, and direct-current power VDD is supplied to the power supply terminal 361. The other end of each connection line 120 is input to a multiplexer 350. In this example, four signals in all as outputs from the four groups are input to the multiplexer 350. It is noted that the multiplexer 350 is an example of a selector set forth in the claims.

The multiplexer 350 sequentially selects the outputs from the groups and outputs the signals to the test terminal 371. The observation signals of the groups are thereby output from the test terminal 371 to a monitor, making it possible to locate the group in which a failure has occurred. It is noted that a more detailed test may be conducted on the group with respect to which the failure is located, by delamination analysis or the like.

[Testing Device]

Figure 8:
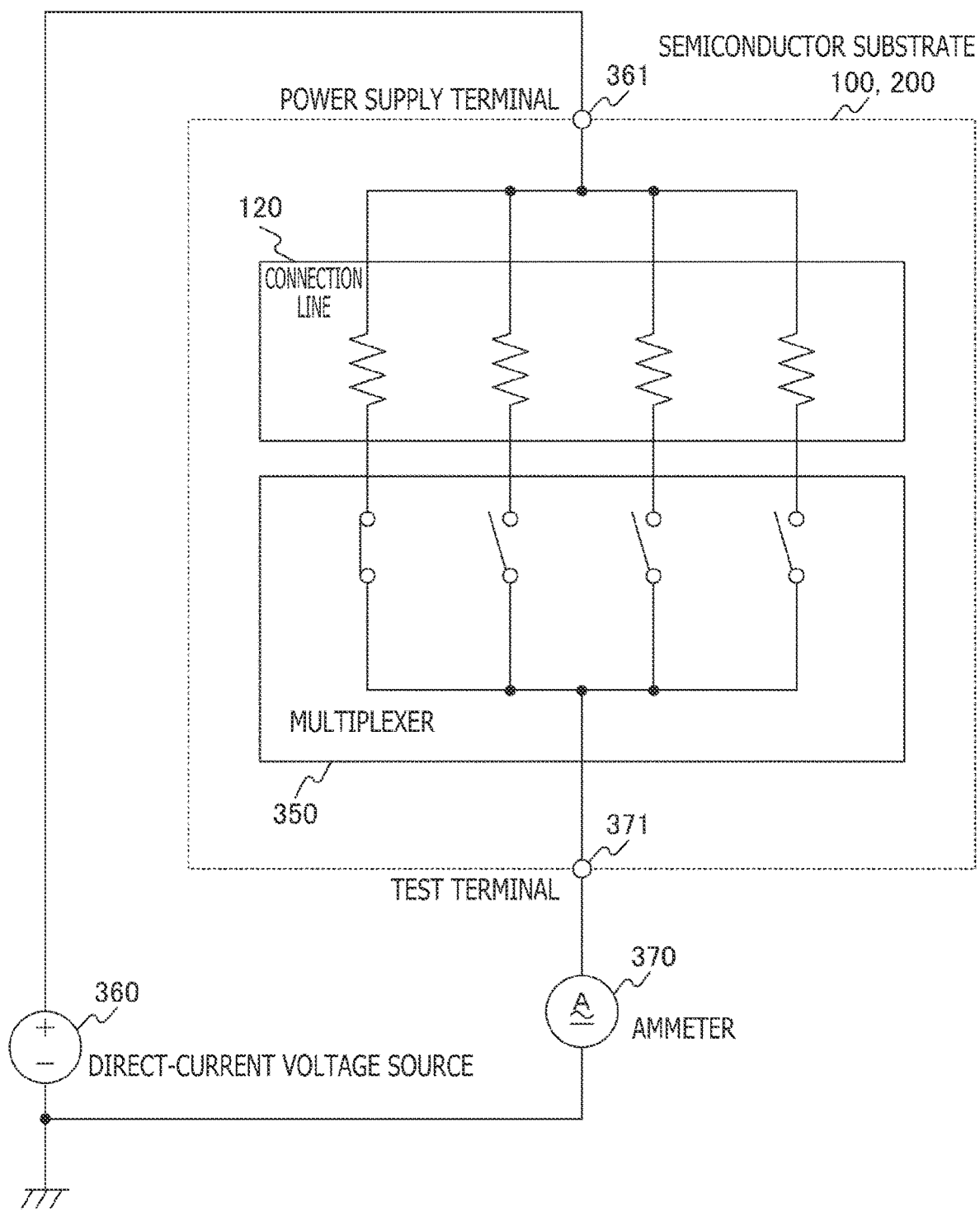
FIG. 8 is a diagram depicting an example of a semiconductor device testing device according to the embodiment of the present technology.

FIG. 8 is a diagram depicting an example of a semiconductor device testing device according to the embodiment of the present technology.

In this example, the multiplexer 350 is mounted on either the first semiconductor substrate 100 or the second semiconductor substrate 200, in addition to the connection line 120 extending over the first semiconductor substrate 100 and the second semiconductor substrate 200 described above.

A direct-current voltage source 360 is connected to the power supply terminal 361, and power is supplied from the direct-current voltage source 360. An ammeter 370 is connected to the test terminal 371, and a current value of a current passed through the connection line 120 is acquired.

Since a voltage value applied from the direct-current voltage source 360 is known, a resistance value of the connection line 120 can be obtained by Ohm's law once the ammeter 370 acquires the current value. Since a high resistance state is indicated in response to occurrence of a failure, it is possible to detect the failure by obtaining the resistance value.

It is noted that the direct-current voltage source 360 is an example of a power supply set forth in the claims. In addition, the ammeter 370 is an example of an observation instrument set forth in the claims.

[Testing Method]

Figure 9:
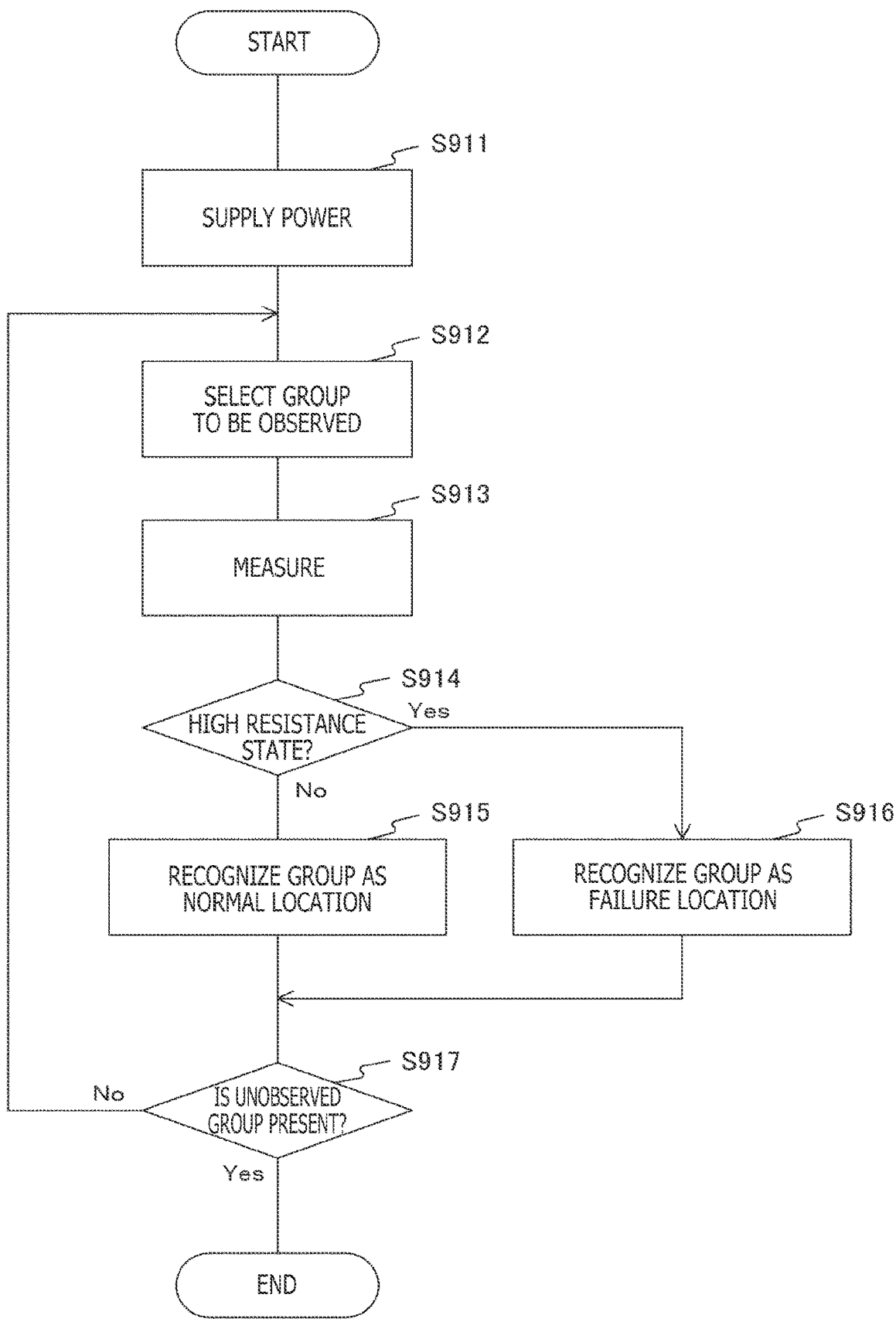
FIG. 9 is a flowchart illustrating an example of procedures of the semiconductor device testing method according to the embodiment of the present technology.

FIG. 9 is a flowchart depicting an example of procedures of a semiconductor device testing method according to the embodiment of the present technology.

First, direct-current power is supplied to the power supply terminal 361 (Step S911). The multiplexer 350 then selects the group to be observed (Step S912). A current is thereby passed through the connection line 120 of the group from the power supply terminal 361 and output to the test terminal 371. The ammeter 370 measures the current value of the current passed through the connection line 120 (Step S913).

The resistance state of the connection line 120 of the group is determined on the basis of the current value measured by the ammeter 370 and the voltage value applied from the direct-current voltage source 360. In a case in which the resistance state indicates a resistance state higher than a predetermined threshold (Step S914: Yes), the group is detected as a failure location (Step S916). On the other hand, in a case in which the resistance state indicates a resistance value not higher than the predetermined threshold (Step S914: No), the group is not detected as the failure location but recognized as a normal location (Step S915).

After observation of the resistance state, processing in Step S912 and subsequent steps is repeated while an unobserved group is still present (Step S917: No).

In such way, according to the embodiment of the present technology, observing the resistance state by using the copper interconnections forming the connection line extending over the first semiconductor substrate 100 and the second semiconductor substrate 200 makes it possible to detect a failure in a neighboring region.

2. Modifications

[First Modification]

Figure 10:
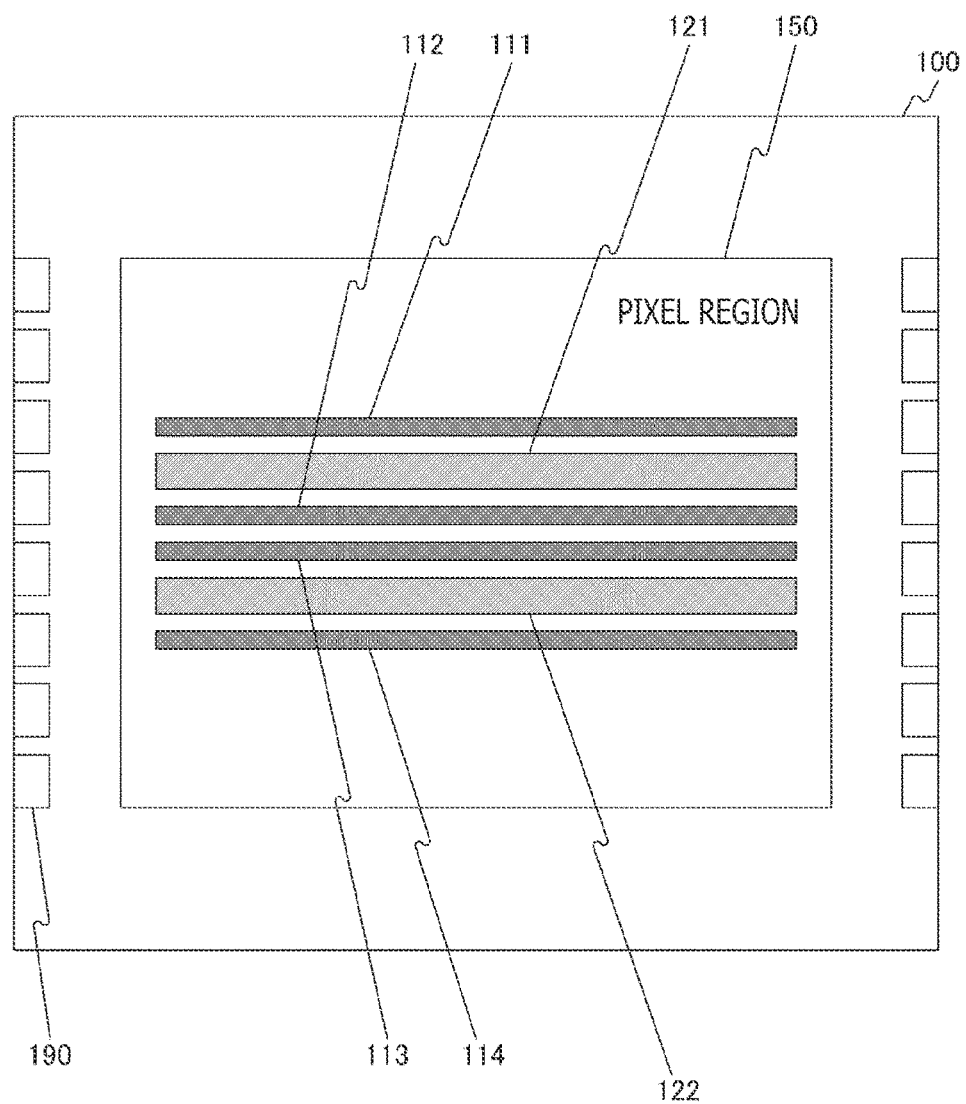
FIG. 10 is a diagram depicting an example of a plane surface of the first semiconductor substrate 100 according to a first modification of the embodiment of the present technology.
Figure 11:
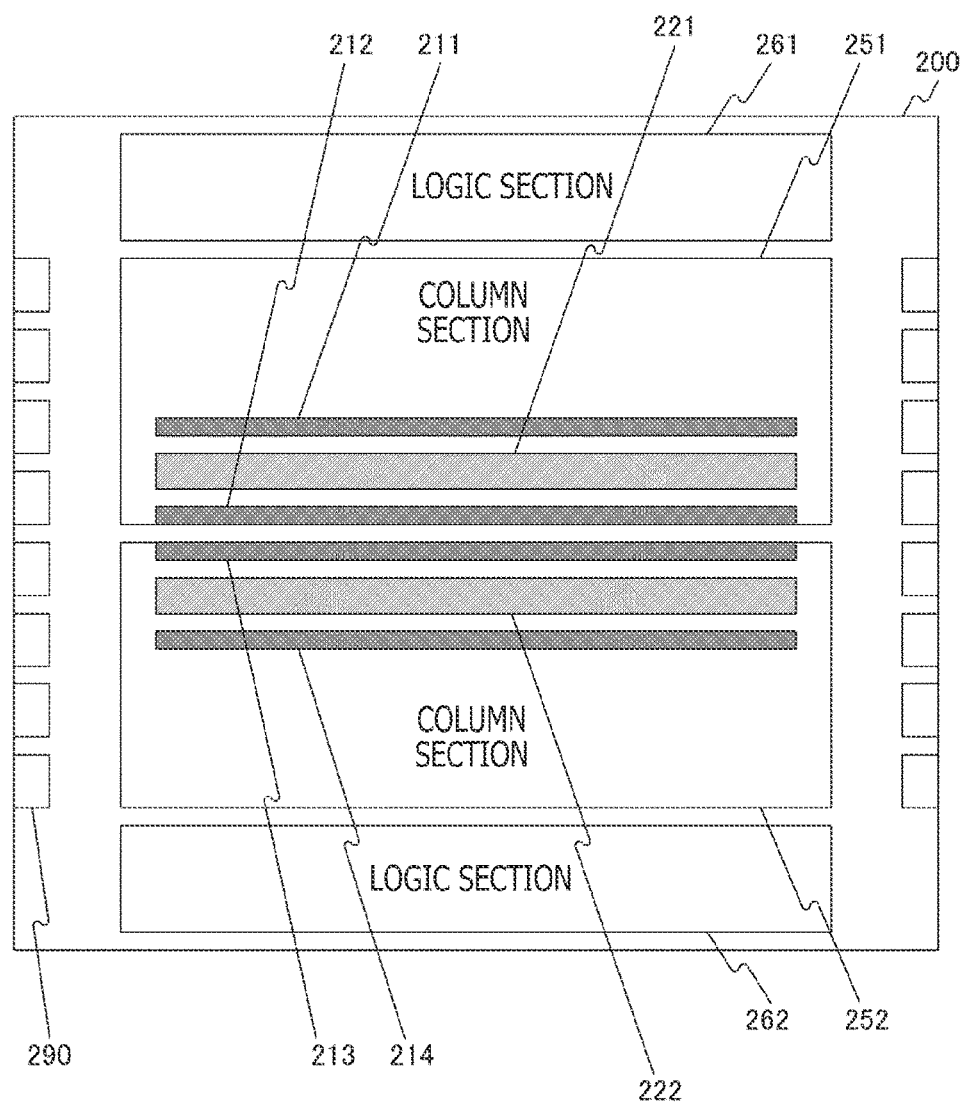
FIG. 11 is a diagram depicting an example of a plane surface of a second semiconductor substrate 200 according to the first modification of the embodiment of the present technology.

FIG. 10 is a diagram depicting an example of a plane surface of the first semiconductor substrate 100 according to a first modification of the embodiment of the present technology. FIG. 11 is a diagram depicting an example of a plane surface of the second semiconductor substrate 200 according to the first modification of the embodiment of the present technology.

This first modification is basically similar to the semiconductor device described in the embodiment described above. In other words, the pixel region 150 is disposed in the central portion of the first semiconductor substrate 100, and the copper interconnections 121 and 122 connecting the vertical signal lines (VSLs) are provided right below the pixel region 150.

On the second semiconductor substrate 200, copper interconnections 221 and 222 are provided at positions corresponding to the copper interconnections 121 and 122 on the first semiconductor substrate 100. Further, the second semiconductor substrate 200 has column sections 251 and 252 and logic sections 261 and 262.

The column sections 251 and 252 correspond to the column signal processing circuits 50 described above and each include an AD converter that converts analog pixel signals from the pixel region 150 into digital signals. The column sections 251 and 252 are disposed separately in association with the copper interconnections 121 and 122 disposed separately.

The logic sections 261 and 262 correspond to the output circuit 60 described above and each include a circuit that performs predetermined signal processing on output signals from the column sections 251 and 252. The logic sections 261 and 262 are disposed separately in association with the copper interconnections 121 and 122 disposed separately.

In this first modification, the copper interconnections 111 to 114 for observation are disposed in the vicinity of the copper interconnections 121 and 122 on the first semiconductor substrate 100. Likewise, copper interconnections 211 to 214 for observation are disposed in the vicinity of the copper interconnections 221 and 222 on the second semiconductor substrate 200. The copper interconnections 111 to 114 and the copper interconnections 211 to 214 are disposed at corresponding positions and brought into contact with each other on the joint surfaces to be electrically connected to each other. The copper interconnections are then connected through the metal interconnection layers on the first semiconductor substrate 100 and the second semiconductor substrate 200, to form the connection line.

[Second Modification]

Figure 12:
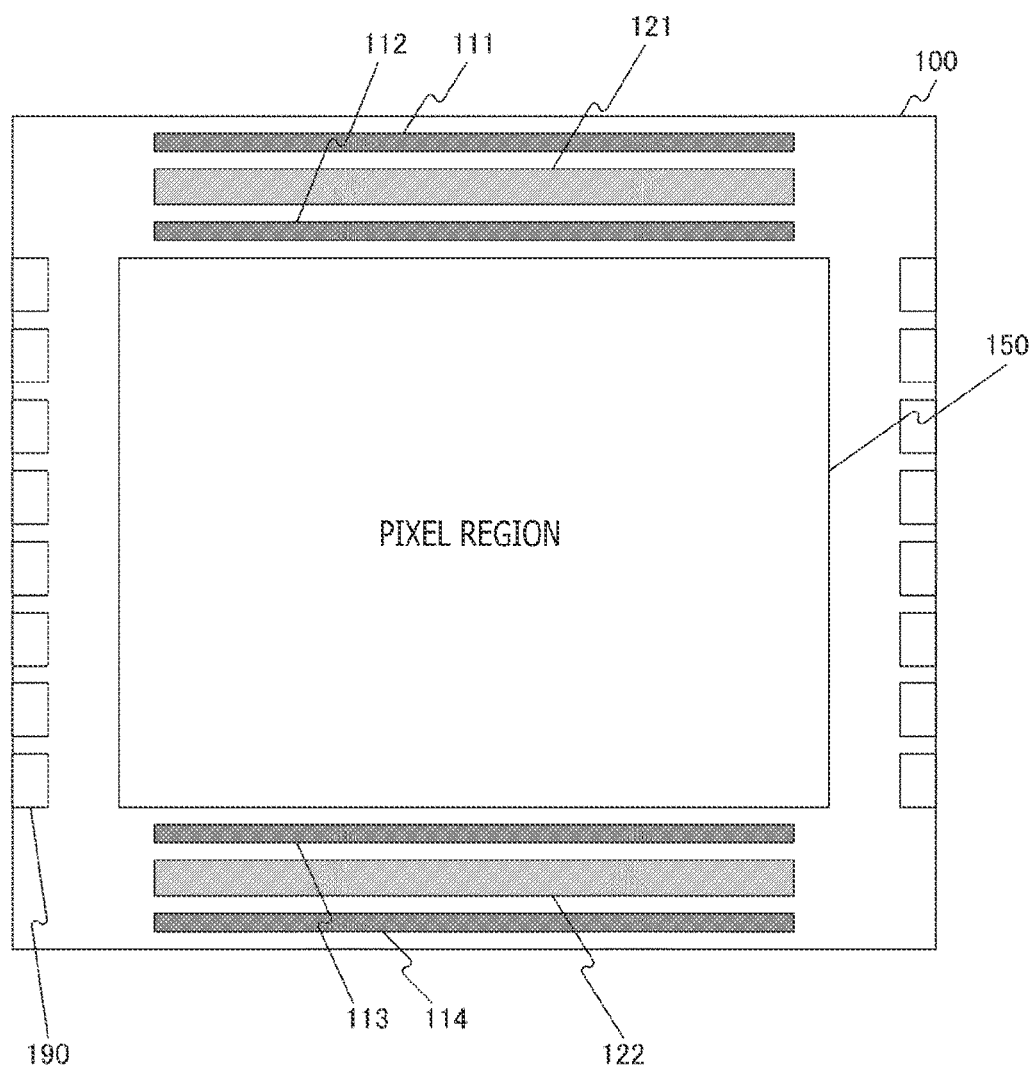
FIG. 12 is a diagram depicting an example of a plane surface of the first semiconductor substrate 100 according to a second modification of the embodiment of the present technology.
Figure 13:
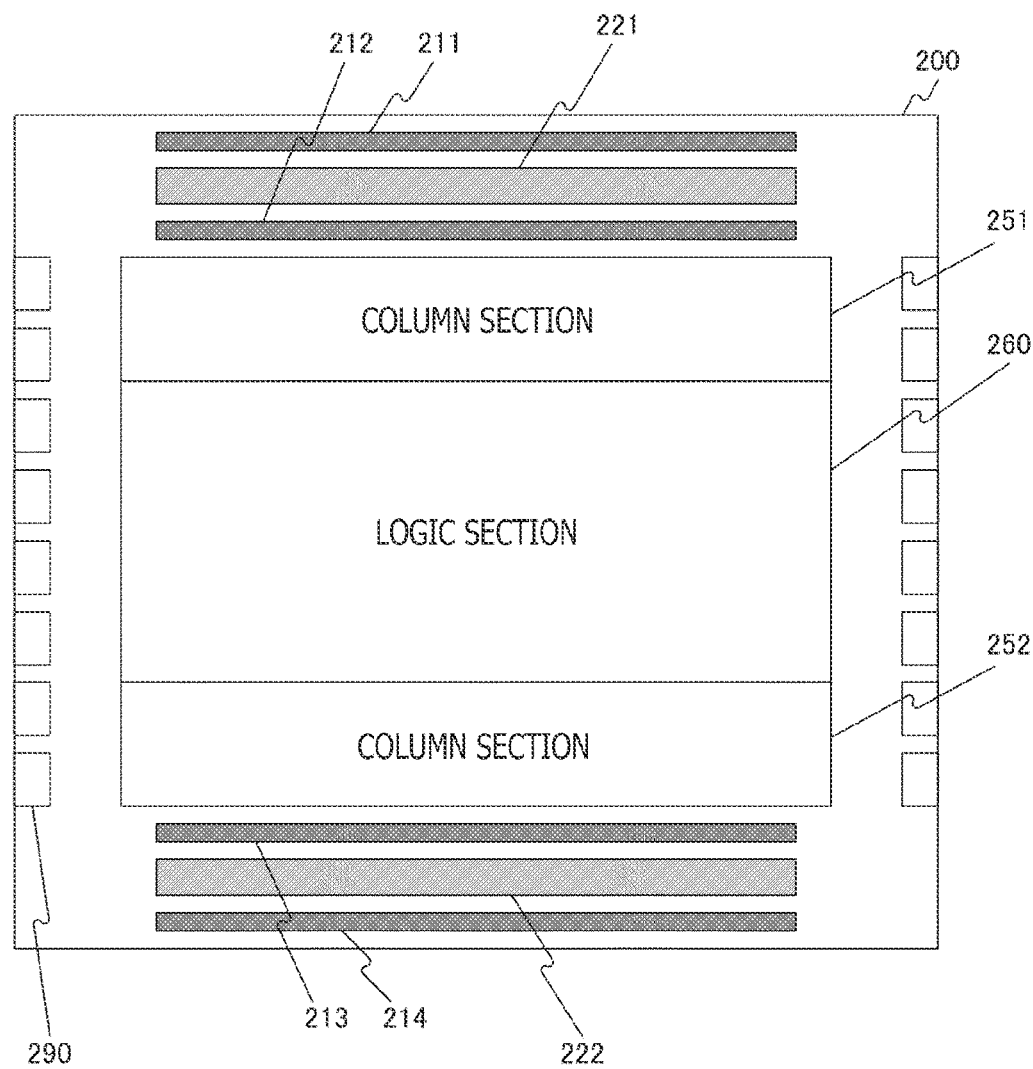
FIG. 13 is a diagram depicting an example of a plane surface of the second semiconductor substrate 200 according to the second modification of the embodiment of the present technology.

FIG. 12 is a diagram depicting an example of a plane surface of the first semiconductor substrate 100 according to a second modification of the embodiment of the present technology. FIG. 13 is a diagram depicting an example of a plane surface of the second semiconductor substrate 200 according to the second modification of the embodiment of the present technology.

While the vertical signal lines (VSLs) are disposed right below the pixel region 150 in the first modification described above, it is supposed in this second modification that the vertical signal lines (VSLs) are disposed in surrounding regions of the pixel region 150. In other words, the copper interconnections 121, 122, 221, and 222 connecting the vertical signal lines (VSLs) are disposed on sides (upper and lower regions in FIGS. 12 and 13) of the pixel region 150. Due to this, the copper interconnections 111 to 114 and 211 to 214 for observation are also disposed on the sides of the pixel region 150.

It is noted that a logic section 260 is integrally disposed in one location in a central portion of the second semiconductor substrate 200 in this second modification.

[Third Modification]

Figure 14:
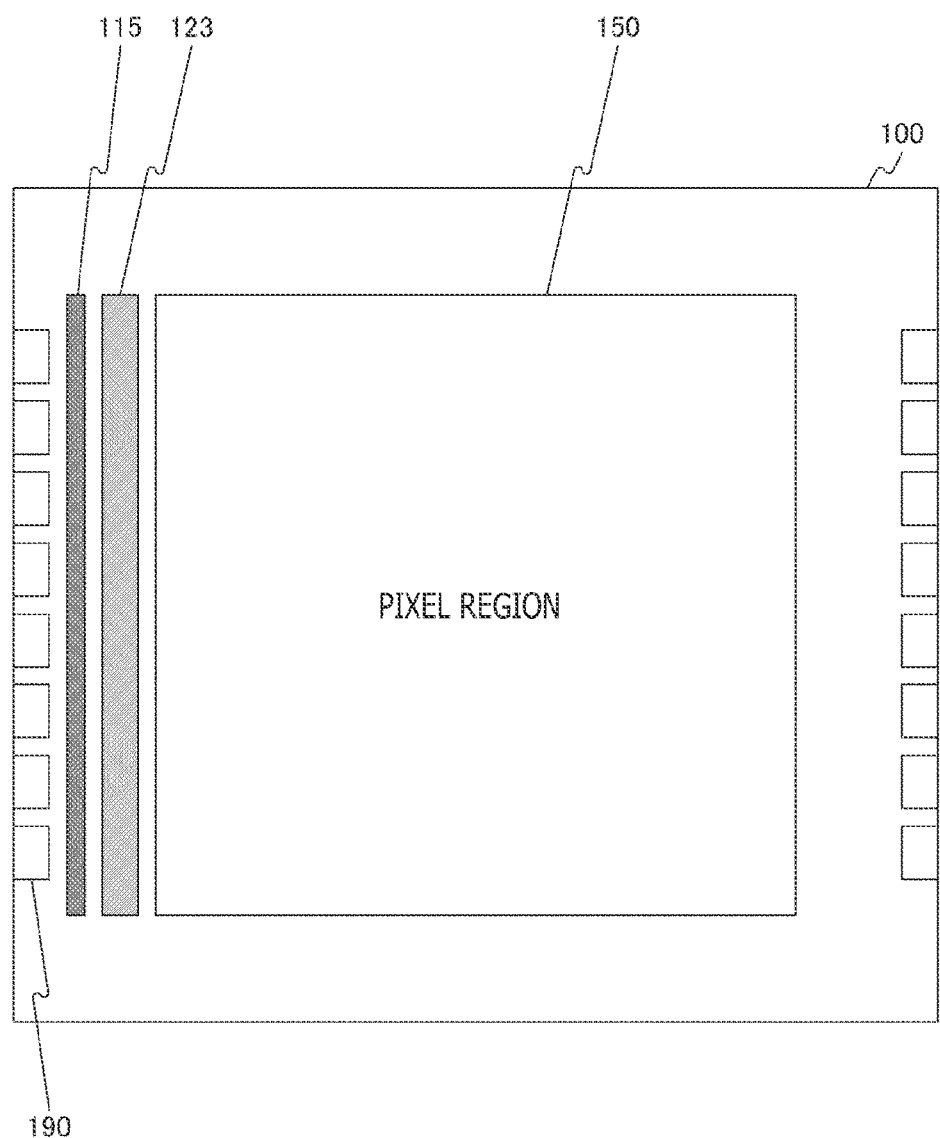
FIG. 14 is a diagram depicting an example of a plane surface of the first semiconductor substrate 100 according to a third modification of the embodiment of the present technology.
Figure 15:
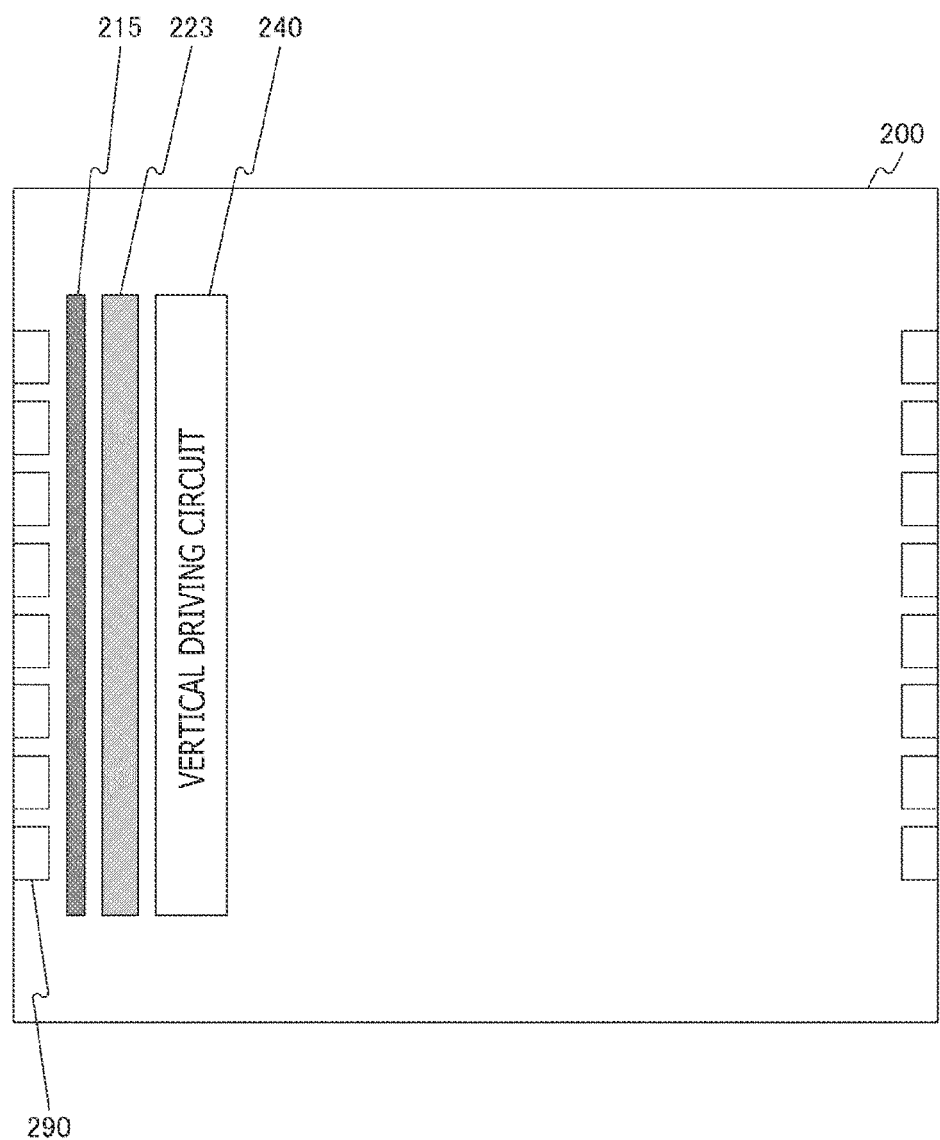
FIG. 15 is a diagram depicting an example of a plane surface of the second semiconductor substrate 200 according to the third modification of the embodiment of the present technology.

FIG. 14 is a diagram depicting an example of a plane surface of the first semiconductor substrate 100 according to a third modification of the embodiment of the present technology. FIG. 15 is a diagram depicting an example of a plane surface of the second semiconductor substrate 200 according to the third modification of the embodiment of the present technology.

In this third modification, it is supposed that a vertical drive circuit 240 corresponding to the vertical drive circuit 20 described above is mounted on the second semiconductor substrate 200, and the vertical drive control signal line is supplied from a copper interconnection 223 on the second semiconductor substrate 200 to the copper interconnection 123 on the first semiconductor substrate 100. Further, the copper interconnections 123 and 223 are objects to be observed, and copper interconnections 115 and 215 for observation are disposed on the first semiconductor substrate 100 and the second semiconductor substrate 200.

It is noted that, while a case of one-side drive, that is, disposing the vertical drive circuit 240 only on a left side, is described in this modification, a case of both-side drive, that is, disposing vertical drive circuits 240 on both the left and right sides, is similarly applicable.

[Fourth Modification]

Figure 16:
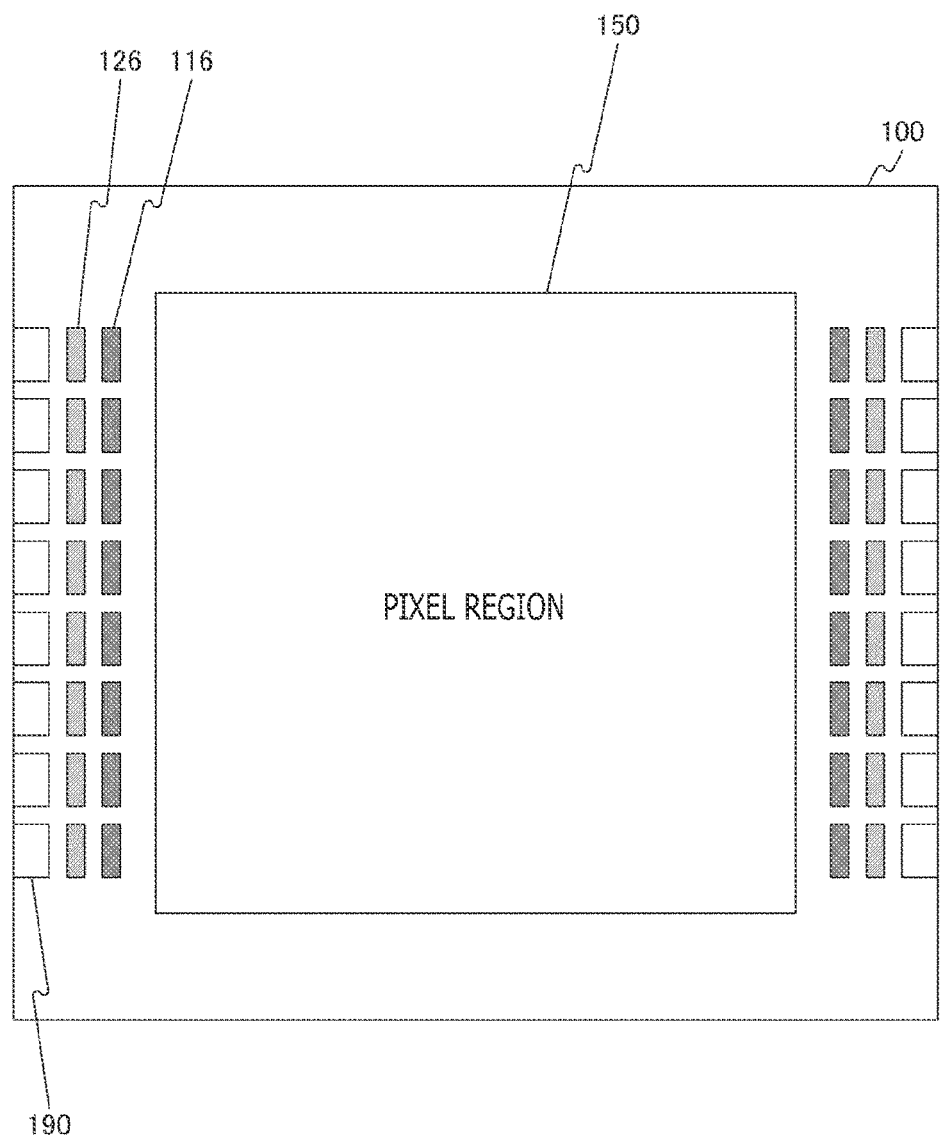
FIG. 16 is a diagram depicting an example of a plane surface of the first semiconductor substrate 100 according to a fourth modification of the embodiment of the present technology.
Figure 17:
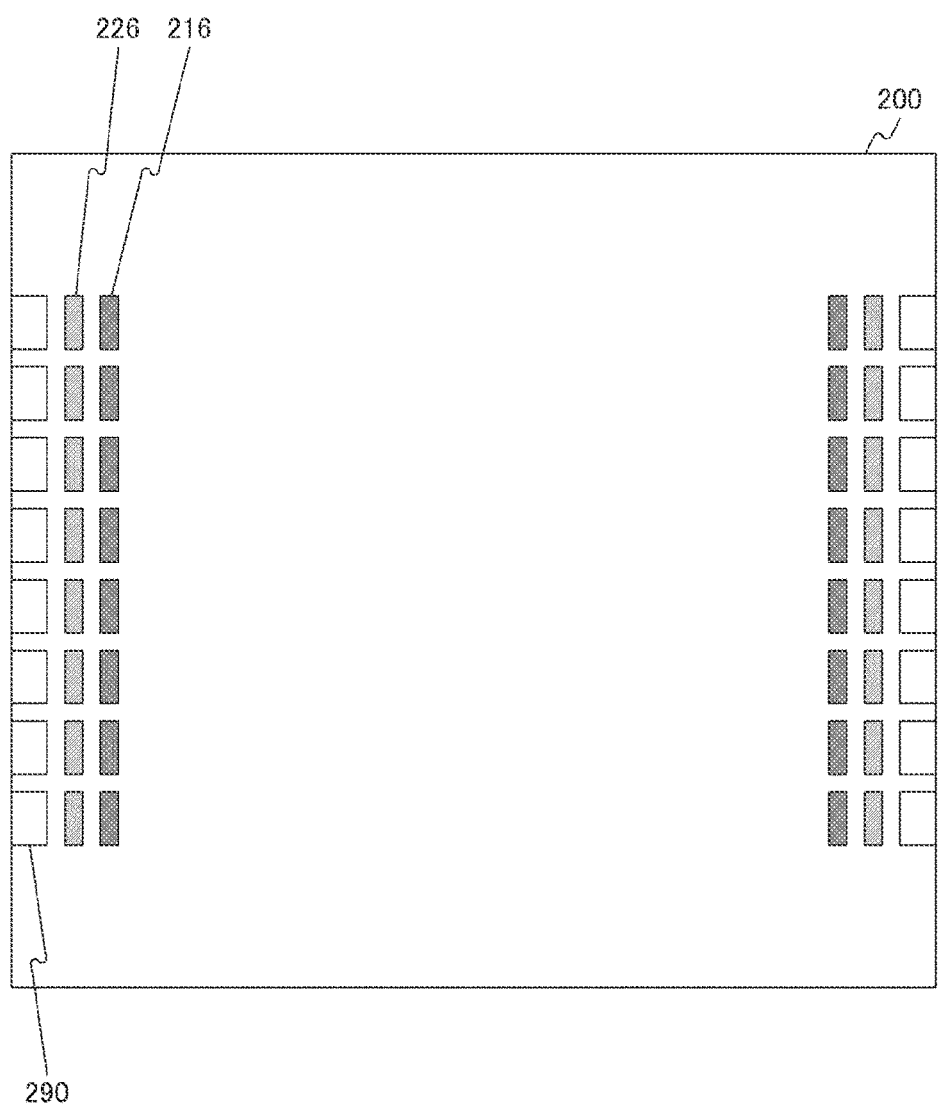
FIG. 17 is a diagram depicting an example of a plane surface of the second semiconductor substrate 200 according to the fourth modification of the embodiment of the present technology.

FIG. 16 is a diagram depicting an example of a plane surface of the first semiconductor substrate 100 according to a fourth modification of the embodiment of the present technology. FIG. 17 is a diagram depicting an example of a plane surface of the second semiconductor substrate 200 according to the fourth modification of the embodiment of the present technology.

In this fourth modification, copper interconnections 126 and 226 are disposed in the vicinity of the input/output pads 190 and 290 on the first semiconductor substrate 100 and the second semiconductor substrate 200, and power supply is performed between the first semiconductor substrate 100 and the second semiconductor substrate 200. Further, the copper interconnections 126 and 226 are objects to be observed, and copper interconnections 116 and 216 for observation are disposed on the first semiconductor substrate 100 and the second semiconductor substrate 200.

It is noted that, while a case of disposing the input/output pads 190 and 290 left and right is described in this modification, a case of disposing the input/output pads 190 and 290 south and north (in upper and lower regions in FIGS. 16 and 17) is similarly applicable.

3. Example of Application to Mobile Body

The technology according to the present disclosure (the present technology) can be applied to various products. For example, the technology according to the present disclosure may be realized as a device mounted in a mobile body of any of kinds including a vehicle, an electric-powered vehicle, a hybrid electric-powered vehicle, a two-wheeled vehicle, a bicycle, a personal mobility, an airplane, a drone, a ship, and a robot.

Figure 18:
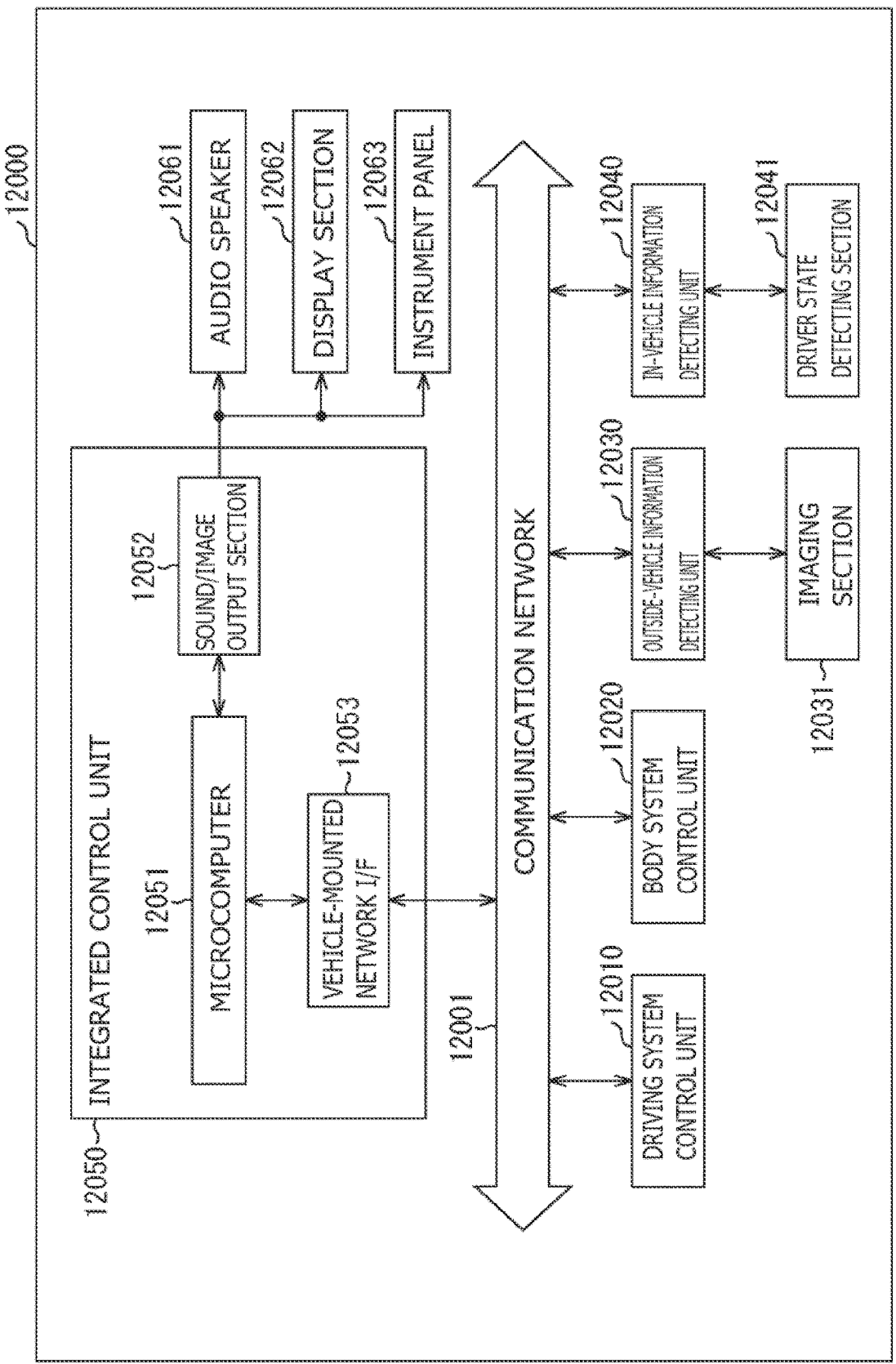
FIG. 18 is a block diagram depicting an example of schematic configuration of a vehicle control system.

FIG. 18 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 18, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 18, an audio speaker 12061, a display section 12062, and an instrument panel 12063 are illustrated as the output device. The display section 12062 may, for example, include at least one of an on-board display and a head-up display.

Figure 19:
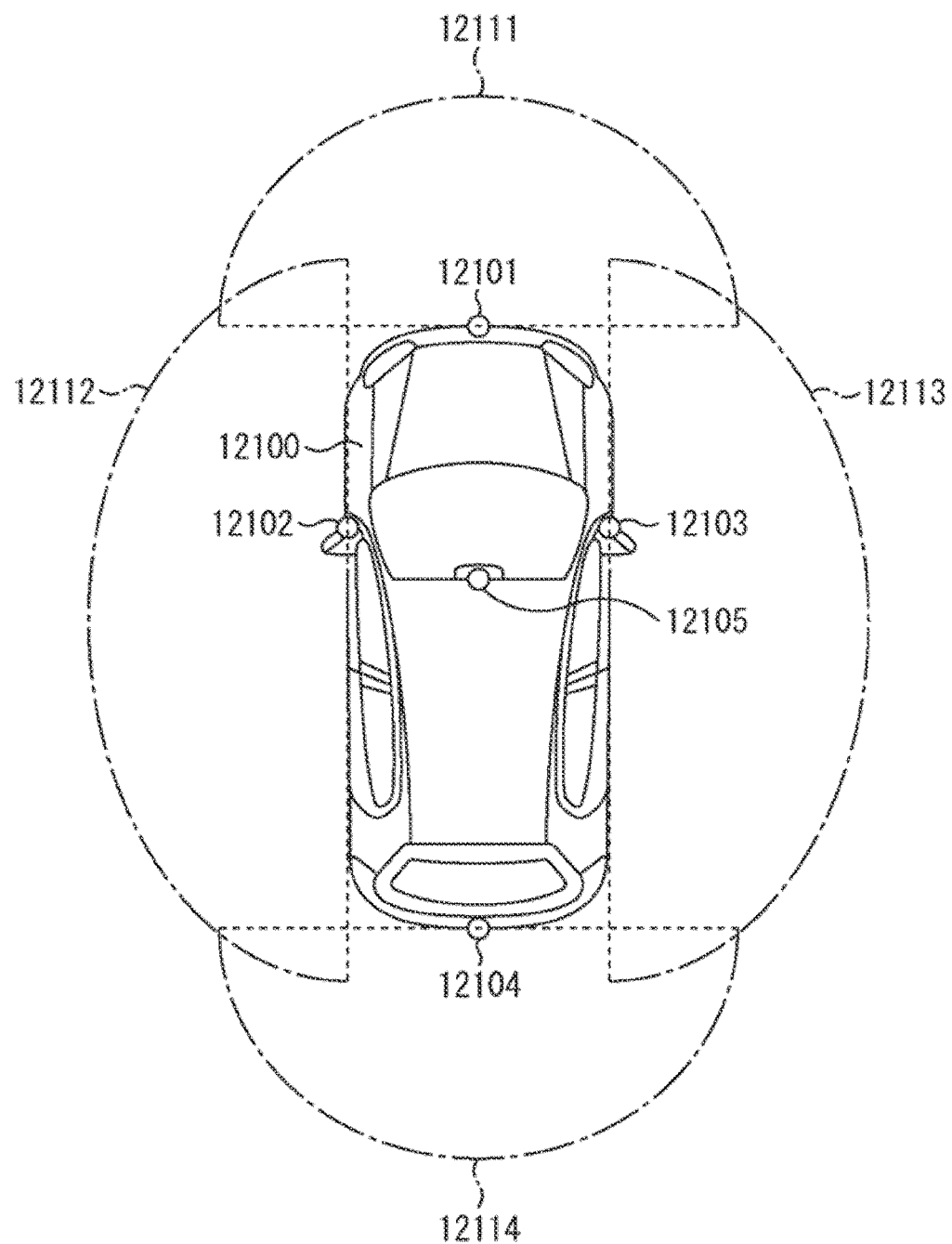
FIG. 19 is a diagram of assistance in explaining an example of installation positions of an outside-vehicle information detecting section and an imaging section.

FIG. 19 is a diagram depicting an example of the installation position of the imaging section 12031.

In FIG. 19, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 19 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure can be applied has been described above. The technology according to the present disclosure can be applied to the imaging section 12031 among the configurations described so far. Specifically, it is possible to detect a failure in the imaging section 12031.

4. Example of Application to Endoscopic Surgery System

The technology according to the present disclosure (the present technology) can be applied to various products. For example, the technology according to the present disclosure may be applied to an endoscopic surgery system.

Figure 20:
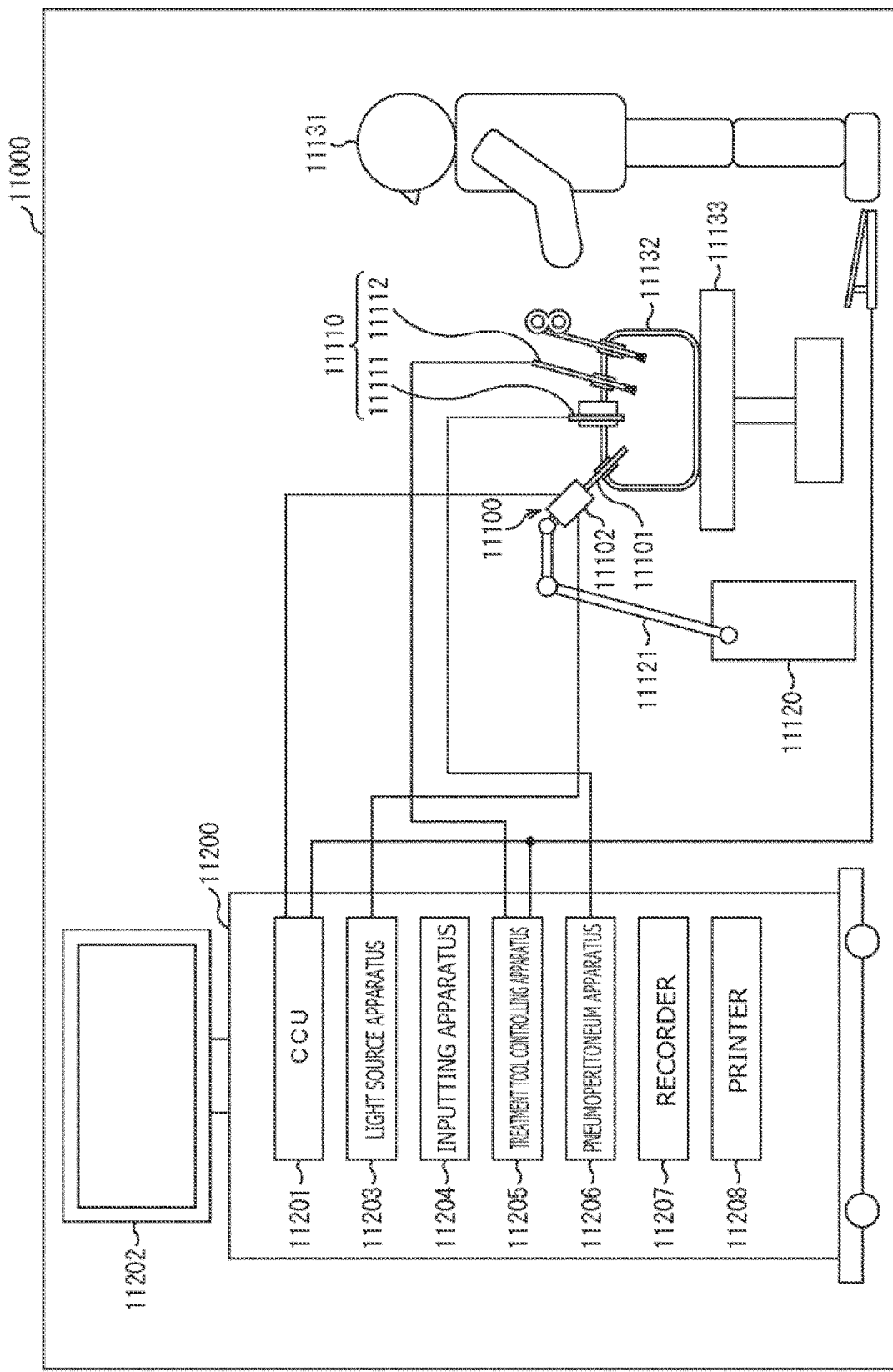
FIG. 20 is a view depicting an example of a schematic configuration of an endoscopic surgery system.

FIG. 20 is a view depicting an example of a schematic configuration of an endoscopic surgery system to which the technology according to an embodiment of the present disclosure (present technology) can be applied.

In FIG. 20, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 21:
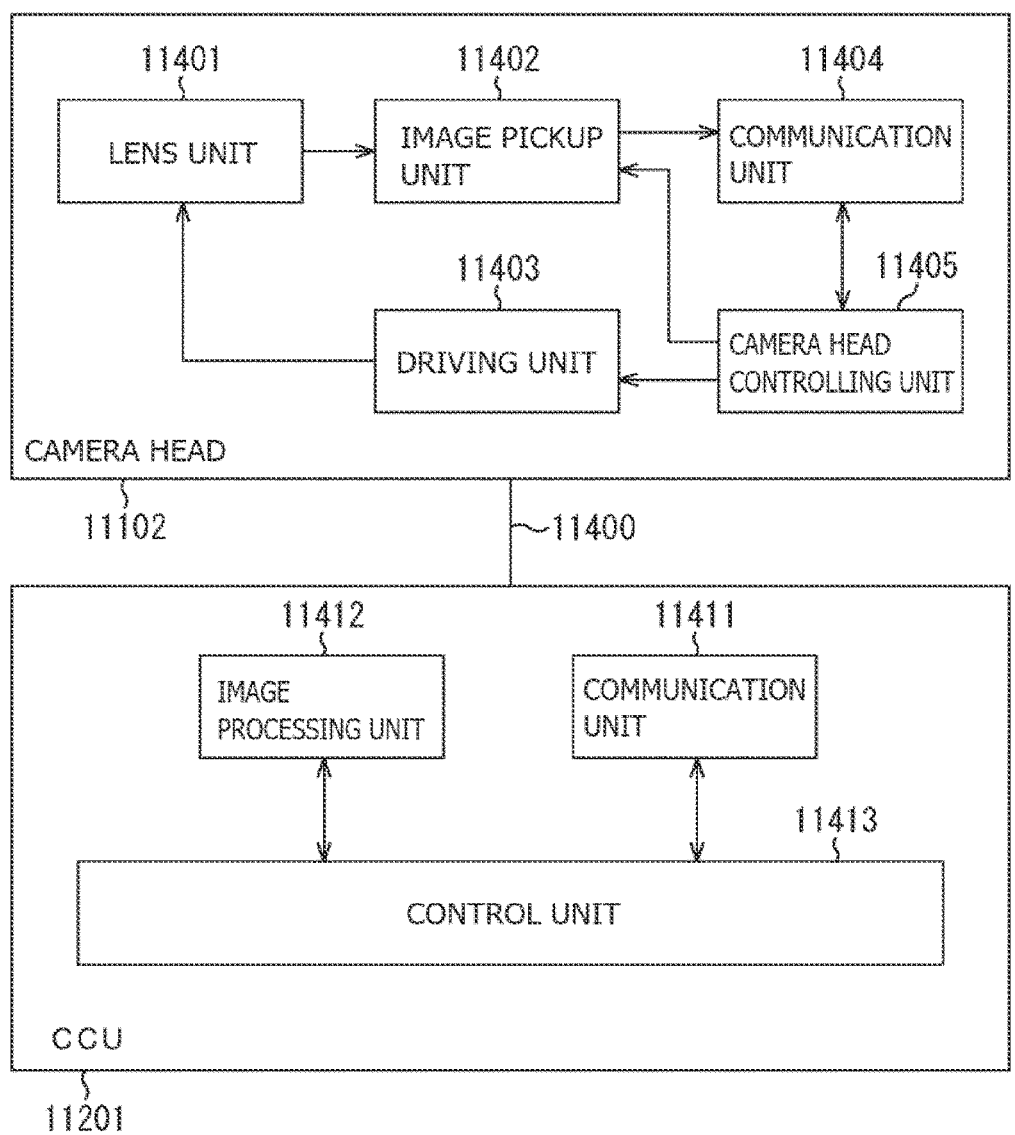
FIG. 21 is a block diagram depicting an example of a functional configuration of a camera head and a camera control unit (CCU).

FIG. 21 is a block diagram depicting an example of a functional configuration of the camera head 11102 and the CCU 11201 depicted in FIG. 20.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of the endoscopic surgery system to which the technology according to the present disclosure can be applied has been described so far. The technology according to the present disclosure can be applied to the image pickup unit 11402 among the configurations described so far. Specifically, it is possible to detect a failure in the image pickup unit 11402.

It is noted that, while the endoscopic surgery system has been described here as an example, the technology according to the present disclosure may be applied to other systems, for example, a microscopic surgery system.

It is noted that the embodiment illustrates an example for embodying the present technology and that a correspondence relation is held between each of the matters in the embodiment and each of invention-specifying matters in the claims. Likewise, a correspondence relation is held between each of the invention-specifying matters in the claims and each of matters denoted by the same name in the embodiment of the present technology. However, the present technology is not limited to the embodiment and can be embodied by making various modifications of the embodiment without departing from the spirit of the technology.

Moreover, processing procedures described in the above embodiment may be regarded as a method involving the series of procedures and may be regarded as a program for causing a computer to execute the series of procedures or as a recording medium that stores the program. Examples of this recording medium include a CD (Compact Disc), an MD (MiniDisc), a DVD (Digital Versatile Disc), a memory card, and a Blu-ray (registered trade mark) Disc.

It is noted that the advantages described in the present specification are given as an example only, and the advantages are not limited to those described in the present specification and may contain other advantages.

It is noted that the present technology can also be configured as follows.

(1) A semiconductor device including:
   a plurality of semiconductor substrates;
   a connection member that is electrically connected on joint surfaces of the plurality of semiconductor substrates to form at least one connection line that extends over the plurality of semiconductor substrates;
   a power supply terminal connected to one end of the connection line; and
   an observation terminal connected to another end of the connection line.

(2) The semiconductor device according to (1), in which the connection member includes a metal electrode that is formed on the joint surfaces of the plurality of semiconductor substrates and that is brought into contact so as to be electrically connected.

(3) The semiconductor device according to (1), in which the connection member includes a through-hole that penetrates at least one of the plurality of semiconductor substrates.

(4) The semiconductor device according to any one of (1) to (3), in which
   the connection line is formed in a vicinity of regions to be observed on the plurality of semiconductor substrates.

(5) The semiconductor device according to any one of (1) to (4), in which
   the connection member includes a plurality of the connection lines each of which has one end connected to the power supply terminal and which are formed in different regions on the plurality of semiconductor substrates.

(6) The semiconductor device according to (5), further including:
  a selector that selects any one of other ends of the plurality of connection lines and that connects the selected other end to the observation terminal.
(7) A semiconductor testing device including:
  a semiconductor device including
    a connection member that is electrically connected on joint surfaces of a plurality of semiconductor substrates to form at least one connection line that extends over the plurality of semiconductor substrates,
    a power supply terminal connected to one end of the connection line, and
    an observation terminal connected to another end of the connection line;
  a power supply that supplies power to the power supply terminal; and
  an observation instrument that is connected to the observation terminal and that observes a current-carrying state.
(8) The semiconductor testing device according to (7), in which
  the power supply includes a direct-current power supply, and
  the observation instrument includes an ammeter that measures a current passed through the observation terminal from the power supply terminal.
(9) The semiconductor testing device according to (7) or (8), in which
  the connection member includes a plurality of the connection lines each of which has one end connected to the power supply terminal and which are formed in different regions on the plurality of semiconductor substrates.
(10) The semiconductor testing device according to (9), further including:
  a selector that selects any one of other ends of the plurality of connection lines and that connects the selected other end to the observation terminal.
(11) A testing method for a semiconductor device including
  a connection member that is electrically connected on joint surfaces of a plurality of semiconductor substrates to form a plurality of connection lines that extend over the plurality of semiconductor substrates,
  a power supply terminal connected to one end of each of the plurality of connection lines, a selector that selects any one of other ends of the plurality of connection lines, and
  an observation terminal connected to an output of the selector, the testing method including:
  a procedure of supplying power to the power supply terminal;
  a procedure of sequentially selecting the plurality of connection lines by the selector; and
  a procedure of observing current-carrying states of the plurality of connection lines via the observation terminal and detecting the connection line indicating a resistance state higher than a predetermined threshold as a failure location.

REFERENCE SIGNS LIST

100, 200: Semiconductor substrate
110 to 116, 210 to 216: Copper interconnection for observation
120: Connection line
101, 102, 121 to 123, 126, 201, 202, 221 to 223, 226: Copper interconnection
103, 131, 132, 203: Dummy copper interconnection
150: Pixel region
190: Input/output pad
199: Joint surfaces
240: Vertical drive circuit
251, 252: Column section
260 to 262: Logic section
350: Multiplexer
360: Direct-current voltage source
361: Power supply terminal
370: Ammeter
371: Test terminal

The invention claimed is:
1. A semiconductor device, comprising:
  a first semiconductor substrate;
  a second semiconductor substrate;
  a connection member that is electrically connected on joint surfaces of the first semiconductor substrate and the second semiconductor substrate to form at least one connection line that extends over the first semiconductor substrate and the second semiconductor substrate,
    wherein the first semiconductor substrate and the second semiconductor substrate are bonded together on the joint surfaces;
  a power supply terminal connected to one end of the at least one connection line; and
  an observation terminal connected to another end of the at least one connection line.
2. The semiconductor device according to claim 1, wherein the connection member includes a metal electrode that is on the joint surfaces of the first semiconductor substrate and the second semiconductor substrate and that is brought into contact so as to be electrically connected.
3. The semiconductor device according to claim 1, wherein the connection member includes a through-hole that penetrates at least one of the first semiconductor substrate or the second semiconductor substrate.
4. The semiconductor device according to claim 1, wherein the connection line is in a vicinity of regions to be observed on the first semiconductor substrate and the second semiconductor substrate.
5. The semiconductor device according to claim 1, wherein the connection member includes a plurality of the connection lines each of which has one end connected to the power supply terminal and which are formed in different regions on the first semiconductor substrate and the second semiconductor substrate.
6. The semiconductor device according to claim 5, further comprising:
  a selector configured to:
  select that selects any one of other ends of the plurality of connection lines; and
  connect the selected other end to the observation terminal.
7. A semiconductor testing device, comprising
  a semiconductor device including:
    a connection member that is electrically connected on joint surfaces of a first semiconductor substrate and a second semiconductor substrate to form at least one connection line that extends over the first semiconductor substrate and the second semiconductor substrate,
      wherein the first semiconductor substrate and the second semiconductor substrate are bonded together on the joint surfaces;

a power supply terminal connected to one end of the at least one connection line, and
an observation terminal connected to another end of the at least one connection line;
a power supply configured to supply power to the power supply terminal; and
an observation instrument configured to:
connect to the observation terminal, and
observe a current-carrying state.

8. The semiconductor testing device according to claim 7, wherein
the power supply includes a direct-current power supply, and
the observation instrument includes an ammeter that is configured to measure a current passed through the observation terminal from the power supply terminal.

9. The semiconductor testing device according to claim 7, wherein the connection member includes a plurality of the connection lines each of which has one end connected to the power supply terminal and which are formed in different regions on the first semiconductor substrate and the second semiconductor substrate.

10. The semiconductor testing device according to claim 9, further comprising:
a selector configured to:
select one of other ends of the plurality of connection lines; and
connect the selected other end to the observation terminal.

11. A testing method for a semiconductor device, including:
a connection member that is electrically connected on joint surfaces of a first semiconductor substrate and a second semiconductor substrate to form a plurality of connection lines that extend over the first semiconductor substrate and the second semiconductor substrate,
a power supply terminal connected to one end of each of the plurality of connection lines,
a selector configured to select one of other ends of the plurality of connection lines, and
an observation terminal connected to an output of the selector, the testing method comprising:
supplying power to the power supply terminal;
sequentially selecting the plurality of connection lines by the selector;
observing current-carrying states of the plurality of connection lines via the observation terminal; and
detecting a connection line indicating a resistance state higher than a threshold as a failure location.

* * * * *